(12) United States Patent
Bae et al.

(10) Patent No.: US 12,029,024 B2
(45) Date of Patent: Jul. 2, 2024

(54) SEMICONDUCTOR MEMORY DEVICES AND METHODS OF FABRICATING THE SAME

(71) Applicant: Samsung Electronics Co., Ltd., Suwon-si (KR)

(72) Inventors: Deokhan Bae, Suwon-si (KR); Juhun Park, Seoul (KR); Yuri Lee, Hwaseong-si (KR); Yoonyoung Jung, Suwon-si (KR); Sooyeon Hong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 443 days.

(21) Appl. No.: 17/538,064

(22) Filed: Nov. 30, 2021

(65) Prior Publication Data

US 2022/0320115 A1   Oct. 6, 2022

(30) Foreign Application Priority Data

Apr. 5, 2021 (KR) .................. 10-2021-0043961
May 28, 2021 (KR) .................. 10-2021-0069543

(51) Int. Cl.
   *H01L 27/12*   (2006.01)
   *H01L 29/06*   (2006.01)
   (Continued)

(52) U.S. Cl.
   CPC ....... *H10B 10/125* (2023.02); *H01L 29/0665* (2013.01); *H01L 29/41733* (2013.01);
   (Continued)

(58) Field of Classification Search
   CPC ...... H10B 10/125; H10B 12/00; H10B 12/34; H10B 41/00; H10B 51/40; H10B 53/30;
   (Continued)

(56) References Cited

U.S. PATENT DOCUMENTS 8,426,310 B2 * 4/2013  Adetutu  ............ H01L 21/76808
                                                        257/E21.584
8,782,571 B2   7/2014  Sun et al.
(Continued)

FOREIGN PATENT DOCUMENTS

JP   2011192744 A   9/2011

*Primary Examiner* — Niki H Nguyen
(74) *Attorney, Agent, or Firm* — Myers Bigel, P.A.

(57) ABSTRACT

A semiconductor memory device includes an active pattern on a substrate, the active pattern including a source/drain pattern in an upper portion thereof, a gate electrode on the active pattern and extended in a first direction, the gate electrode and the source/drain pattern adjacent to each other in a second direction that crosses the first direction, and a shared contact coupled to the source/drain pattern and the gate electrode to electrically connect the source/drain pattern and the gate electrode. The shared contact includes active and gate contacts, which are electrically connected to the source/drain pattern and the gate electrode, respectively. The gate contact includes a body portion coupled to the gate electrode and a protruding portion, which protrudes from the body portion in the second direction and extends into and buried in the active contact.

20 Claims, 33 Drawing Sheets

(51) Int. Cl.
*H01L 29/417* (2006.01)
*H01L 29/423* (2006.01)
*H01L 29/78* (2006.01)
*H01L 29/786* (2006.01)
*H10B 10/00* (2023.01)

(52) U.S. Cl.
CPC .. *H01L 29/41791* (2013.01); *H01L 29/42392* (2013.01); *H01L 29/7851* (2013.01); *H01L 29/78696* (2013.01)

(58) Field of Classification Search
CPC ..... H10B 53/50; H10B 51/30; H01L 29/0665; H01L 29/41733; H01L 29/41791; H01L 29/78696; H01L 29/7851; H01L 27/1214; H01L 29/4908; H01L 29/786; H01L 29/7827; H01L 29/78645; H01L 27/088; H01L 27/092; H01L 29/4236; H01L 29/78642; H01L 29/7889; H01L 21/76831; H01L 21/76834; H01L 25/0657; H01L 23/535; H01L 21/845; H01L 29/41725
See application file for complete search history.

(56) References Cited

U.S. PATENT DOCUMENTS

| | | | |
|---|---|---|---|
| 9,190,404 B2* | 11/2015 | Lee | H01L 27/0207 |
| 9,202,751 B2 | 12/2015 | Wei et al. | |
| 2008/0203450 A1* | 8/2008 | Naruse | H01L 27/14689 |
| | | | 257/E31.001 |
| 2011/0294292 A1* | 12/2011 | Adetutu | H01L 21/76807 |
| | | | 257/E21.585 |
| 2013/0161722 A1 | 6/2013 | Son et al. | |
| 2014/0035048 A1* | 2/2014 | Lee | H01L 27/088 |
| | | | 257/288 |
| 2018/0286957 A1 | 10/2018 | Bae et al. | |
| 2019/0267459 A1* | 8/2019 | Bae | H01L 27/1211 |
| 2019/0363085 A1 | 11/2019 | Oh et al. | |
| 2020/0090999 A1 | 3/2020 | Hsu et al. | |
| 2020/0168617 A1 | 5/2020 | Hong et al. | |

* cited by examiner

SEMICONDUCTOR MEMORY DEVICES AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2021-0043961 filed on Apr. 5, 2021, and to Korean Patent Application No. 10-2021-0069543, filed on May 28, 2021, in the Korean Intellectual Property Office, and the entire contents of each above-identified application are hereby incorporated by reference.

TECHNICAL FIELD

The present disclosure relates to semiconductor memory devices and to methods of fabricating the same, and in particular, to semiconductor memory devices including static random access memory (SRAM) cells and to methods of fabricating the same.

BACKGROUND

Due to their small sizes, multifunctionality, and/or low-cost characteristics, semiconductor devices are important elements in the electronics industry. Semiconductor devices are classified into semiconductor memory devices configured to store data, semiconductor logic devices configured to process data, and hybrid semiconductor devices that include both memory and logic elements. As the electronic industry advances, there is an increasing demand for semiconductor devices with improved characteristics. For example, there is an increasing demand for semiconductor devices with high reliability, high performance, and/or increased numbers and types of functions. To meet this demand, complexity and/or integration density of semiconductor devices are being increased.

SUMMARY

Some embodiments of the inventive concepts provide semiconductor memory devices with improved electric characteristics.

Some embodiments of the inventive concepts provide methods of fabricating semiconductor memory devices with improved electric characteristics.

According to some embodiments of the inventive concepts, a semiconductor memory device may include an active pattern on a substrate, the active pattern including a source/drain pattern in an upper portion thereof, a gate electrode on the active pattern and extended in a first direction, the gate electrode and the source/drain pattern adjacent to each other in a second direction that crosses the first direction, and a shared contact coupled to the source/drain pattern and the gate electrode to electrically connect the source/drain pattern with the gate electrode. The shared contact may include an active contact electrically connected to the source/drain pattern and a gate contact electrically connected to the gate electrode. The gate contact may include a body portion, which is coupled to the gate electrode, and a protruding portion, which protrudes from the body portion in the second direction. The protruding portion extends into the active contact and may be buried in the active contact.

According to some embodiments of the inventive concepts, a semiconductor memory device may include an SRAM cell on a substrate. The SRAM cell may include first pull-up/down transistors and second pull-up/down transistors, and a first node connecting a first common source/drain of the first pull-up/down transistors to a first common gate of the second pull-up/down transistors. The first node may include a first shared contact that is coupled to the first common source/drain and the first common gate to electrically connect the common source/drain with the first common gate. The first shared contact may include an active contact, which is electrically connected to the first common source/drain, and the first shared contact may include a gate contact, which is electrically connected to the first common gate. The gate contact may include a body portion, which is coupled to the first common gate, and a protruding portion, which protrudes from the body portion toward the active contact. A top surface of the body portion may be coplanar with a top surface of the active contact. The protruding portion may vertically overlap the active contact, and the body portion may be horizontally offset from the active contact.

According to some embodiments of the inventive concepts, a semiconductor memory device may include a substrate including a bit cell region, a first active pattern and a second active pattern on the bit cell region, the first active pattern being spaced apart from the second active pattern in a first direction, the first active pattern including a first source/drain pattern provided in an upper portion thereof, the second active pattern including a second source/drain pattern provided in an upper portion thereof, a device isolation layer provided on the substrate to cover a side surface of a lower portion of each of the first and second active patterns, an upper portion of each of the first and second active patterns extending above the device isolation layer, a gate electrode provided on the first active pattern and extended in the first direction, the gate electrode and the first source/drain pattern being adjacent to each other in the second direction, a gate insulating layer between the gate electrode and the first active pattern, a gate spacer on at least one side surface of the gate electrode, a gate capping pattern on the gate electrode, an interlayer insulating layer on the gate capping pattern, an active contact, that extends through the interlayer insulating layer, is coupled to the first and second source/drain patterns, and is extended in the first direction to connect the first and second source/drain patterns to each other, a silicide pattern between each of the first and second source/drain patterns and the active contact, a gate that extends through the gate capping pattern and is coupled to the gate electrode, and a first interconnection layer, a second interconnection layer, and a third interconnection layer that are sequentially stacked on the interlayer insulating layer. The gate contact may include a body portion, which is coupled to the gate electrode, and a protruding portion, which protrudes from the body portion in the second direction. The protruding portion may extend into the active contact and may be buried in the active contact.

According to some embodiments of the inventive concepts, a method of fabricating a semiconductor memory device may include forming an active pattern on a substrate, forming a gate electrode, which extends in a first direction, on the active pattern, forming a source/drain pattern in an upper portion of the active pattern, the gate electrode and the source/drain pattern adjacent to each other in a second direction that crosses the first direction, forming an active contact coupled to the source/drain pattern, forming a gate contact coupled to the active contact and the gate electrode, at least a portion of the gate contact vertically overlapping the active contact, and performing a planarization process to expose a top surface of the active contact. The active contact and the gate contact may be connected to each other as a shared contact.

DETAILED DESCRIPTION

Figure 1:
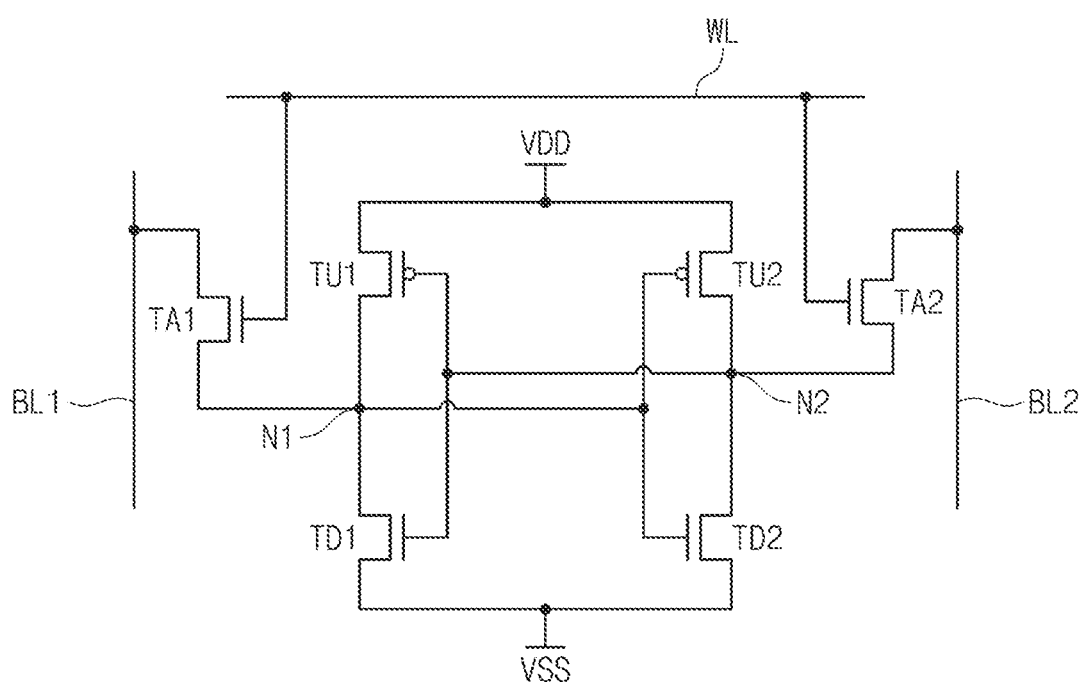
FIG. 1 is an equivalent circuit diagram illustrating an SRAM cell according to some embodiments of the inventive concepts.

FIG. 1 is an equivalent circuit diagram illustrating a static random access memory (SRAM) cell according to some embodiments of the inventive concepts.

Referring to FIG. 1, the SRAM cell may include a first pull-up transistor TU1, a first pull-down transistor TD1, a second pull-up transistor TU2, a second pull-down transistor TD2, a first pass-gate transistor TA1, and a second pass-gate transistor TA2. The first and second pull-up transistors TU1 and TU2 may be PMOS transistors. The first and second pull-down transistors TD1 and TD2 and the first and second pass-gate transistors TA1 and TA2 may be NMOS transistors.

A first source/drain of the first pull-up transistor TU1 and a first source/drain of the first pull-down transistor TD1 may both be connected to a first node N1. A second source/drain of the first pull-up transistor TU1 may be connected to a power line VDD, and a second source/drain of the first pull-down transistor TD1 may be connected to a ground line VSS. A gate of the first pull-up transistor TU1 and a gate of the first pull-down transistor TD1 may be electrically connected to each other. The first pull-up transistor TU1 and the first pull-down transistor TD1 may constitute a first inverter. The connected gates of the first pull-up transistor TU1 and the first pull-down transistor TD1 may correspond to an input terminal of the first inverter, and the first node N1 may correspond to an output terminal of the first inverter.

A first source/drain of the second pull-up transistor TU2 and a first source/drain of the second pull-down transistor TD2 may both be connected to a second node N2. A second source/drain of the second pull-up transistor TU2 may be connected to the power line VDD, and a second source/drain of the second pull-down transistor TD2 may be connected to the ground line VSS. A gate of the second pull-up transistor TU2 and a gate of the second pull-down transistor TD2 may be electrically connected to each other. Thus, the second pull-up transistor TU2 and the second pull-down transistor TD2 may constitute a second inverter. The connected gates of the second pull-up transistor TU2 and the second pull-down transistor TD2 may correspond to an input terminal of the second inverter, and the second node N2 may correspond to an output terminal of the second inverter.

The first and second inverters may be combined to form a latch structure. For example, the gates of both the first pull-up transistor TU1 and the first pull-down transistor TD1 may be electrically connected to the second node N2, and the gates of both the second pull-up transistor TU2 and the second pull-down transistor TD2 may be electrically connected to the first node N1. A first source/drain of the first pass-gate transistor TA1 may be connected to the first node N1, and a second source/drain of the first pass-gate transistor TA1 may be connected to a first bit line BL1. A first source/drain of the second pass-gate transistor TA2 may be connected to the second node N2, and a second source/drain of the second pass-gate transistor TA2 may be connected to a second bit line BL2. Gates of the first pass-gate transistor TA1 and the second pass-gate transistor TA2 may be electrically coupled to a word line WL. Thus, the SRAM cell according to some embodiments of the inventive concepts may be realized.

Figure 2:
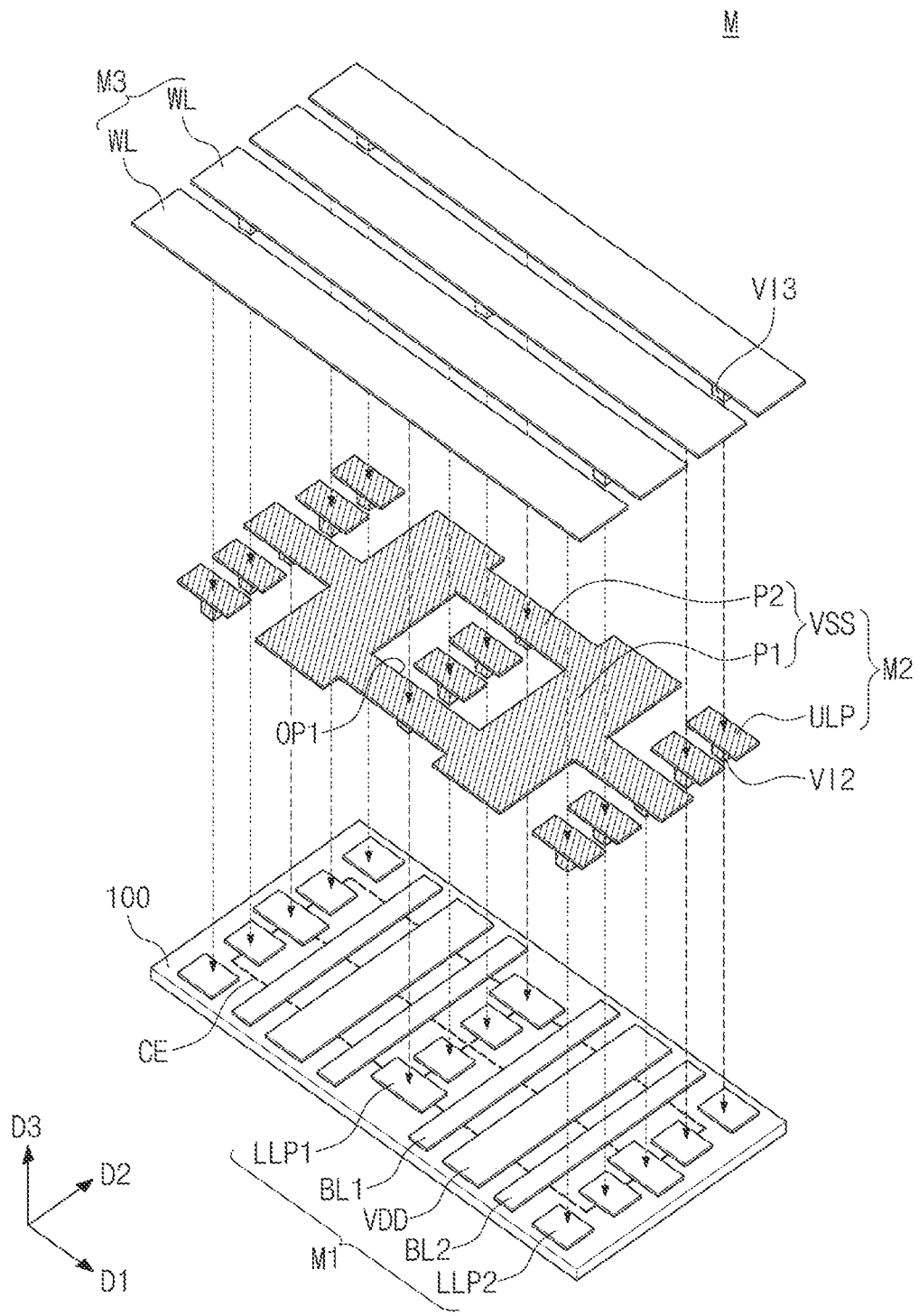
FIG. 2 is a perspective view illustrating interconnection layers of a semiconductor memory device according to some embodiments of the inventive concepts.
Figure 3:
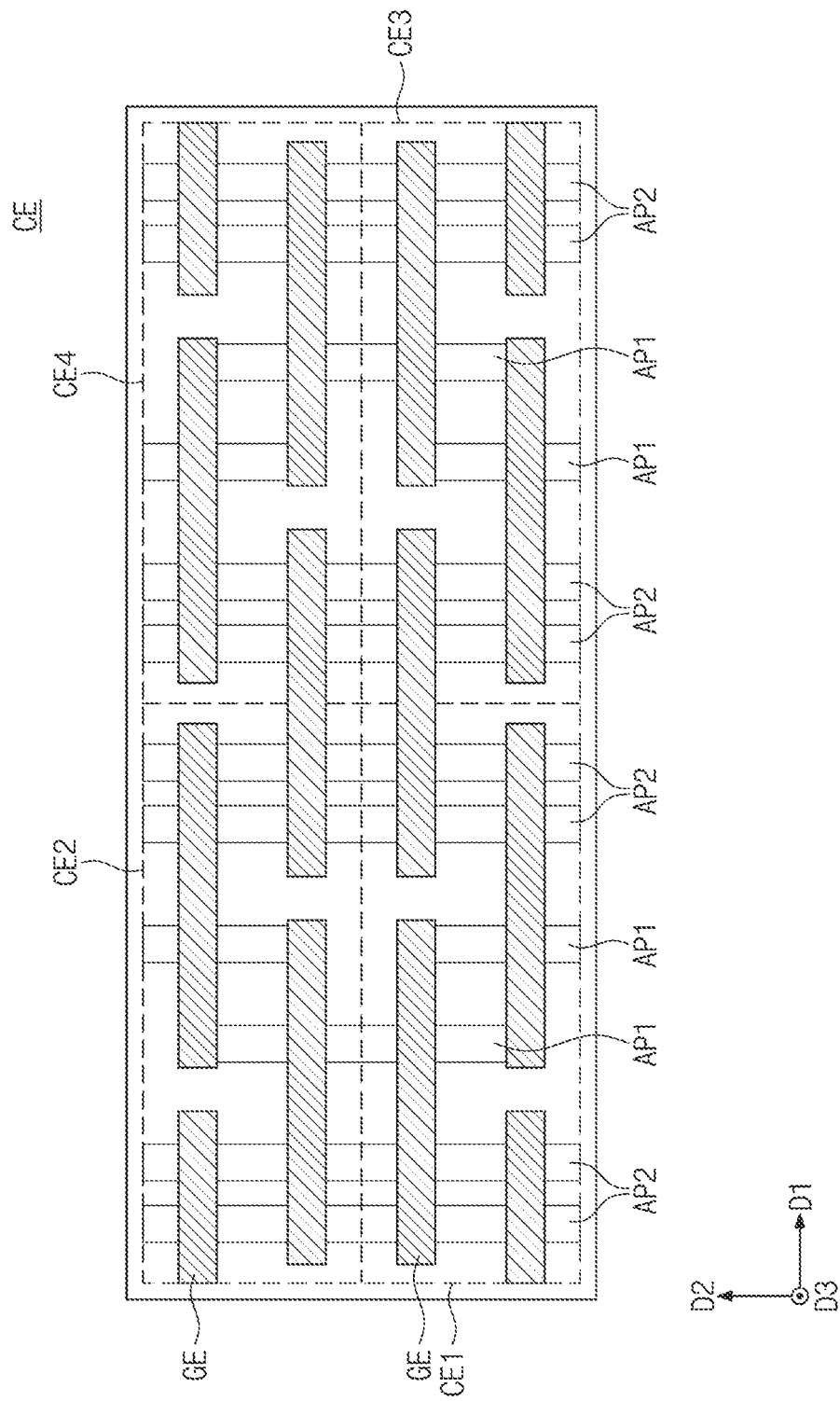
FIG. 3 is a plan view illustrating a memory cell of FIG. 2.

FIG. 2 is a perspective view illustrating interconnection layers of a semiconductor memory device according to some embodiments of the inventive concepts. FIG. 3 is a plan view illustrating a memory cell of FIG. 2.

Referring to FIGS. 2 and 3, a memory cell CE may be provided on a substrate 100. Referring to FIG. 3, the memory cell CE may include first to fourth bit cells CE1 to CE4, which are arranged in a 2×2 array. Each of the first to fourth bit cells CE1 to CE4 may be a SRAM cell, such as that previously described with reference to FIG. 1. As a representative example of the first to fourth bit cells CE1 to CE4, a structure of the first bit cell CE1 will be described in more detail with reference to FIGS. 4 and 5A to 5E. Each of the second to fourth bit cells CE2, CE3, and CE4 may be provided to have a structure similar to and/or symmetric to the first bit cell CE1.

A first interconnection layer M1, a second interconnection layer M2, and a third interconnection layer M3 may be provided on the memory cell CE. The first to third interconnection layers M1, M2, and M3 may be sequentially stacked. The first to third interconnection layers M1, M2, and M3 may be stacked in a third direction D3. The first to third interconnection layers M1, M2, and M3 may be formed of or include at least one of conductive metal nitrides (e.g., titanium nitride or tantalum nitride) or metallic materials (e.g., titanium, tantalum, tungsten, copper, or aluminum).

The first interconnection layer M1 may include the first bit line BL1, the second bit line BL2, and the power line VDD, which may extend in a second direction D2. The power line VDD may be interposed between the first bit line BL1 and the second bit line BL2. When viewed in a plan view, the first bit line BL1, the second bit line BL2, and the power line VDD may have line-shaped patterns. A width of the power line VDD may be larger than a width of each of the first and second bit lines BL1 and BL2, when measured in a first direction D1. The first direction D1, second direction D2, and third direction D3 may be perpendicular to each other.

The first interconnection layer M1 may further include at least one first lower landing pad LLP1 and at least one second lower landing pad LLP2, which may be provided proximate to the first and second bit lines BL1 and BL2. In some embodiments, the first interconnection layer M1 may include a plurality of first lower landing pads LLP1 and a plurality of second lower landing pads LLP2. The first and second lower landing pads LLP1 and LLP2 may be spaced apart from each other in the second direction D2. When viewed in a plan view, each of the first and second lower landing pads LLP1 and LLP2 may be an island-shape pattern.

The first interconnection layer M1 may further include first vias (not shown in FIGS. 2 and 3), which are respectively provided below the first bit line BL1, the second bit line BL2, the power line VDD, the first lower landing pad LLP1, and the second lower landing pad LLP2. The memory cell CE and the first interconnection layer M1 may be electrically connected to each other through the first vias.

The second interconnection layer M2 may include the ground line VSS and at least one upper landing pad ULP. The ground line VSS may be a mesh-shaped conductive structure. The ground line VSS may have at least one first opening OP1. In detail, the ground line VSS may include at least one first portion P1 that extends in the second direction D2 and at least one second portion P2 extending in the first direction D1. A width of the first portion P1 in the first direction D1 may be larger than a width of the second portion P2 in the second direction D2. The first opening OP1 may be defined by an adjacent pair of the first portions P1 and an adjacent pair of the second portions P2.

An adjacent pair of the upper landing pads ULP may be within the first opening OP1. The adjacent pair of the upper landing pads ULP in the first opening OP1 may be spaced apart from each other in the second direction D2. When viewed in a plan view, the upper landing pads ULP may be island-shaped patterns.

The second portions P2 of the ground line VSS may overlap the first lower landing pads LLP1 in the third direction D3, e.g., when viewed in a plan view. The upper landing pads ULP may overlap the second lower landing pads LLP2, when viewed in a plan view.

The second interconnection layer M2 may further include second vias VI2, which are respectively provided below the ground line VSS and the upper landing pads ULP. The ground line VSS may be electrically connected to the first lower landing pads LLP1 of the first interconnection layer M1 through the second vias VI2. A plurality of the second vias VI2 may be provided below the ground line VSS, and a plurality of the first lower landing pads LLP1 may be connected in common to a single ground line VSS. The upper landing pads ULP may be electrically connected to the second lower landing pads LLP2 of the first interconnection layer M1 through respective second vias VI2.

In some embodiments, the second interconnection layer M2 may include only the ground line VSS, the upper landing pads ULP, and the second vias VI2. In other words, the second interconnection layer M2 may not include any other line (e.g., a bit line, a power line, and a word line), except for the ground line VSS.

The third interconnection layer M3 may include the word lines WL, which may extend in the first direction D1. The word lines WL may be spaced apart from each other in the second direction D2. When viewed in a plan view, the word lines WL may be line-shaped patterns.

The third interconnection layer M3 may further include at least one third via VI3 provided below the word line WL. Each word line WL may be electrically connected to at least one upper landing pad ULP of the second interconnection layer M2 through at least one third via VI3. In other words, each word line WL may be electrically connected to at least one second lower landing pad LLP2 of the first interconnection layer M1 through a third via VI3, an upper landing pad ULP, and a second via VI2.

In some embodiments, the third interconnection layer M3 may include only the word lines WL and the third vias VI3. In other words, the third interconnection layer M3 may not include any other line (e.g., the bit line, the power line, and the ground line), except for the word lines WL.

Figure 4:
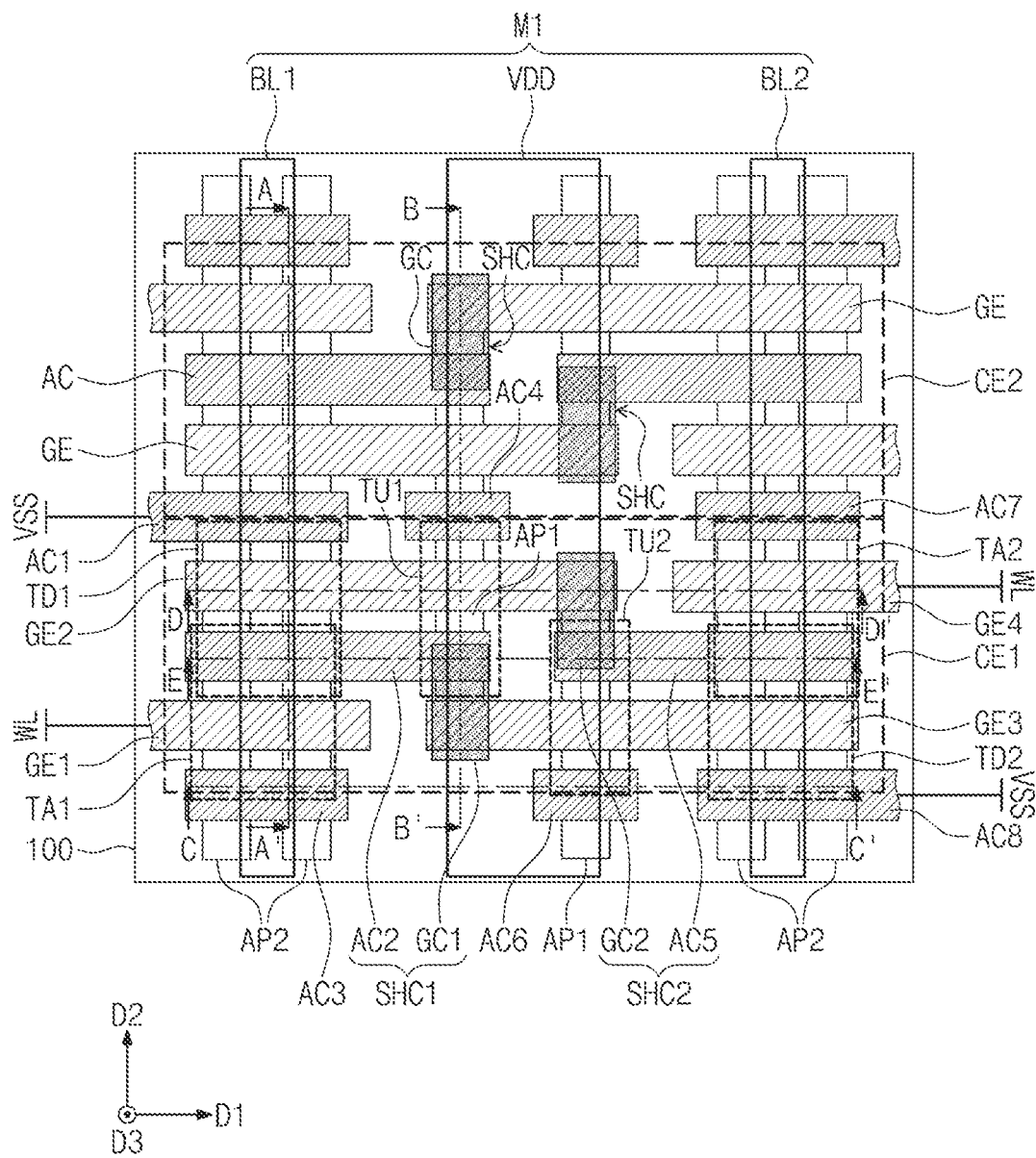
FIG. 4 is a plan view illustrating a semiconductor memory device according to some embodiments of the inventive concepts.

FIG. 4 is a plan view illustrating a semiconductor memory device according to some embodiments of the inventive concepts. FIG. 4 is a plan view illustrating an SRAM cell according to the circuit diagram of FIG. 1 (in particular, the first and second bit cells of FIG. 3). FIGS. 5A to 5E are sectional views taken along lines A-A', B-B', C-C', D-D', and E-E' of FIG. 4, respectively. FIG. 6A is an enlarged sectional view of a portion 'M' of FIG. 5B. FIG. 6B is a perspective view schematically illustrating a first shared contact of FIG. 6A.

Referring to FIGS. 1, 3, 4, and 5A to 5E, each of the first and second bit cells CE1 and CE2 on the substrate 100 may include a SRAM cell of FIG. 1, such as that discussed with respect to FIG. 1. The second bit cell CE2 may be disposed to be adjacent to the first bit cell CE1 in the second direction D2. First and second active patterns AP1 and AP2, gate electrodes GE, active contacts AC, and gate contacts GC may be provided on the first and second bit cells CE1 and CE2. Hereinafter, as a representative example of the bit cells, the first bit cell CE1 will be described in more detail below.

A device isolation layer ST may be provided on the substrate 100. The device isolation layer ST may define the first and second active patterns AP1 and AP2. The substrate 100 may be a semiconductor substrate that is formed of or includes silicon, germanium, silicon-germanium, or a compound semiconductor material. The device isolation layer ST may be formed of or include at least one insulating material (e.g., silicon oxide).

The first and second active patterns AP1 and AP2 may be portions of the substrate 100. A trench TR may be defined between adjacent ones of the first and second active patterns AP1 and AP2. The device isolation layer ST may be within the trench TR. Upper portions of the first and second active patterns AP1 and AP2 may be vertically extended and have a shape that protrudes above the device isolation layer ST. Each of the upper portions of the first and second active patterns AP1 and AP2 may be a fin-shape structure that vertically protrudes above the device isolation layer ST. For example, each of the first and second active patterns AP1 and AP2 may be an active fin.

In some embodiments, the first bit cell CE1 may include a pair of the first active patterns AP1 and two pairs of the second active patterns AP2. One pair of the two pairs of the second active patterns AP2 may constitute a body of the first pass-gate transistor TA1 and a body of the first pull-down transistor TD1. The other pair of the two pairs of the second active patterns AP2 may constitute a body of the second pass-gate transistor TA2 and a body of the second pull-down transistor TD2. One of the pair of the first active patterns AP1 may constitute a body of the first pull-up transistor TU1. The other of the pair of the first active patterns AP1 may constitute a body of the second pull-up transistor TU2. A distance between the two active patterns AP1 of an adjacent pair of the first active patterns AP1 may be larger than a distance between the two active patterns AP2 of an adjacent pair of the second active patterns AP2.

In some embodiments, two second active patterns AP2 may be provided instead of the two pairs (or four) of the second active patterns AP2. In other words, in some embodiments one pair of the second active patterns AP2, which are adjacent to each other, may be merged to form a single second active pattern AP2.

First channel patterns CH1 and first source/drain patterns SD1 may be provided in the upper portions of the first active patterns AP1. Second channel patterns CH2 and second source/drain patterns SD2 may be provided in the upper portions of the second active patterns AP2. The first source/drain patterns SD1 may be p-type impurity regions. The second source/drain patterns SD2 may be n-type impurity regions. Each of the first channel patterns CH1 may be interposed between a pair of the first source/drain patterns SD1, and each of the second channel patterns CH2 may be interposed between a pair of the second source/drain patterns SD2.

The first and second source/drain patterns SD1 and SD2 may be epitaxial patterns formed by a selective epitaxial growth process. The first and second source/drain patterns SD1 and SD2 may have top surfaces that are located at a level higher than top surfaces of the first and second channel patterns CH1 and CH2. The first and second source/drain patterns SD1 and SD2 may be formed of or include a semiconductor material that is the same as or different from that of the substrate 100. In some embodiments, the first source/drain patterns SD1 may be formed of or include a semiconductor material whose lattice constant is greater than that of the substrate 100. Thus, the first source/drain patterns SD1 may exert a compressive stress on the first channel patterns CH1. In some embodiments, the second source/drain patterns SD2 may be formed of or include the same semiconductor material as the substrate 100.

The second source/drain patterns SD2 on an adjacent pair of the second active patterns AP2 may be merged to form a single second source/drain electrode. This may be because a distance between the pair of the second active patterns AP2 is relatively small (as best seen in FIG. 5C).

The gate electrodes GE may include first to fourth gate electrodes GE1 to GE4 on the first bit cell CE1. The first to fourth gate electrodes GE1 to GE4 may extend in the first direction D1 and may cross the first and second active patterns AP1 and AP2. The first to fourth gate electrodes GE1 to GE4 may overlap the first and second channel patterns CH1 and CH2 when viewed in a plan view. The first gate electrode GE1 may be symmetric to the fourth gate electrode GE4, and the second gate electrode GE2 may be symmetric to the third gate electrode GE3.

The second gate electrode GE2 and the fourth gate electrode GE4 may be aligned to be parallel to the first direction D1 and to be parallel to each other. An insulating pattern SP may be interposed between the second gate electrode GE2 and the fourth gate electrode GE4 to separate them from each other. The first gate electrode GE1 and the third gate electrode GE3 may be aligned to be parallel to the first direction D1 and to be parallel to each other. As best seen in FIG. 5D, the insulating pattern SP may be interposed between the first gate electrode GE1 and the third gate electrode GE3 to separate them from each other.

Figure 5A:
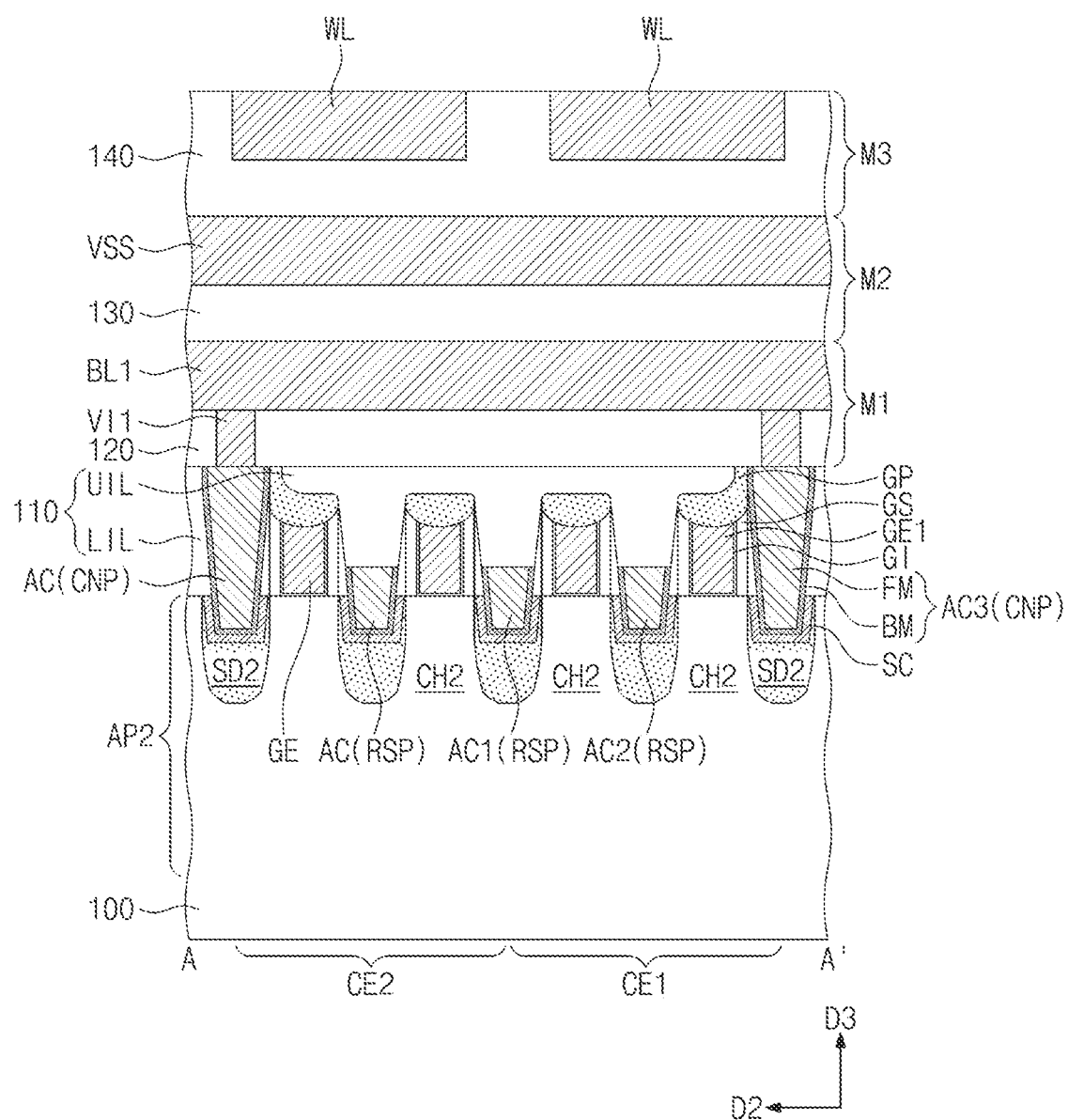
FIGS. 5A to 5E are sectional views taken along lines A-A', B-B', C-C', D-D', and E-E' of FIG. 4, respectively.
Figure 5B:
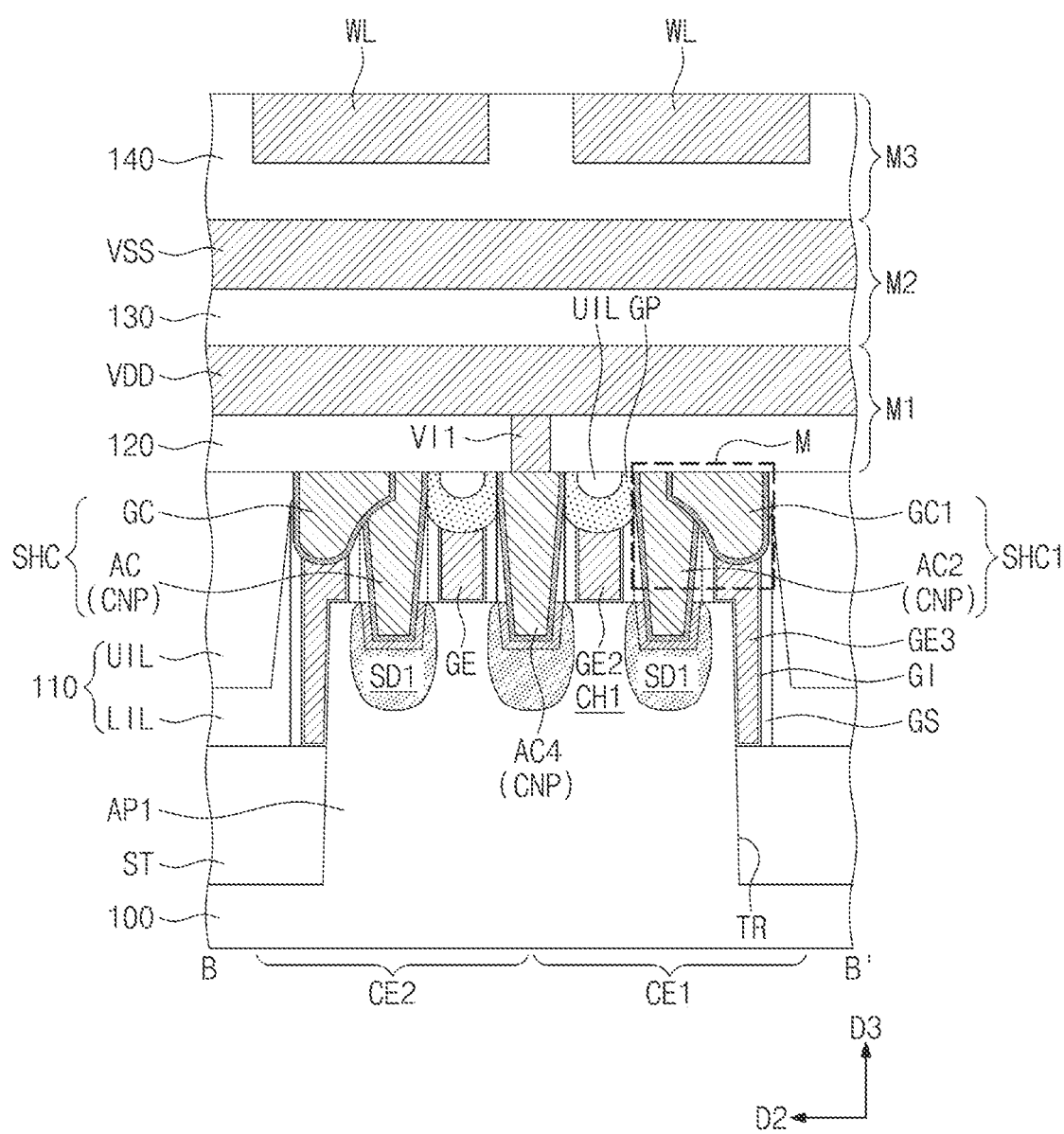
Figure 5C:
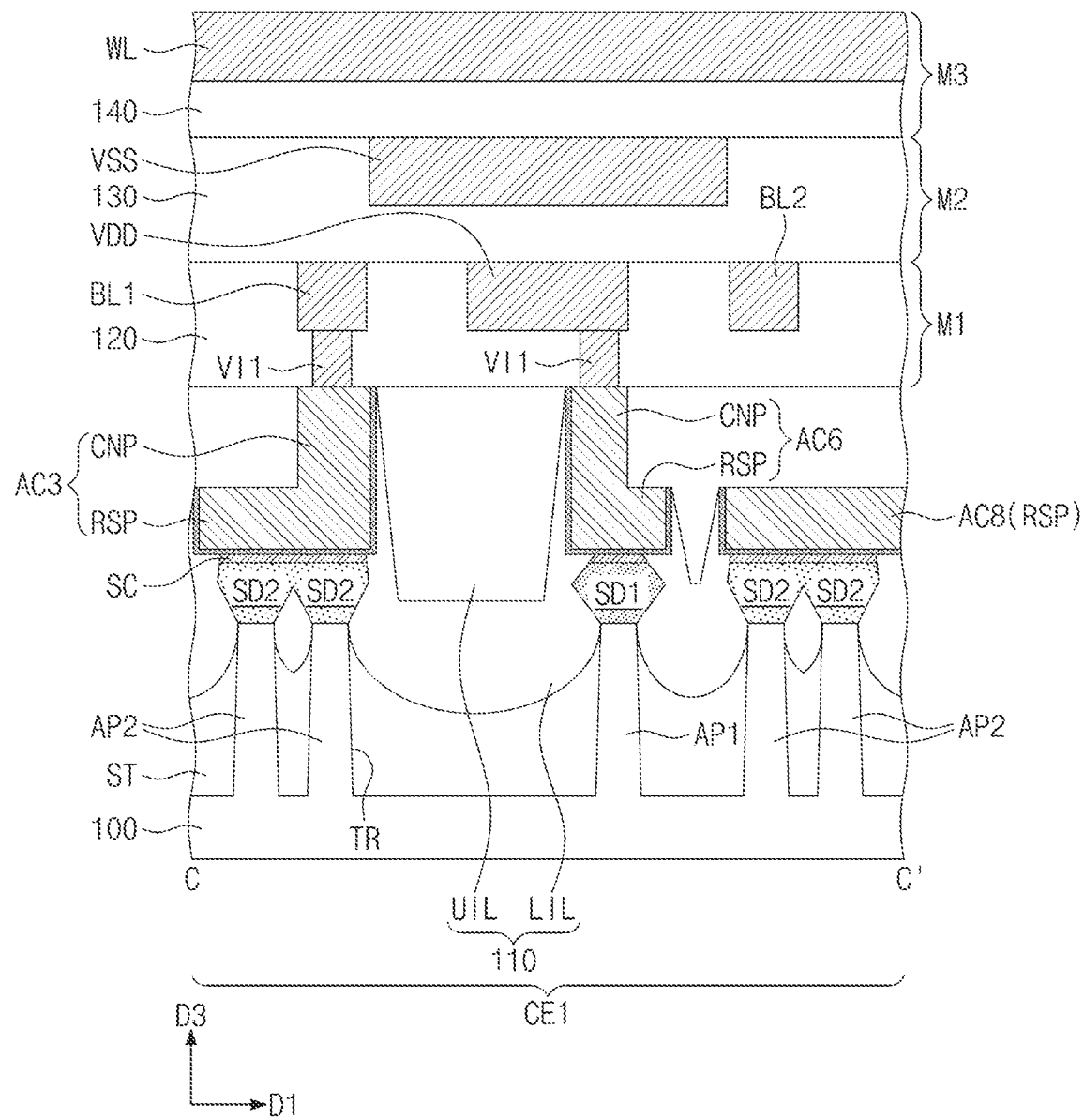
Figure 5D:
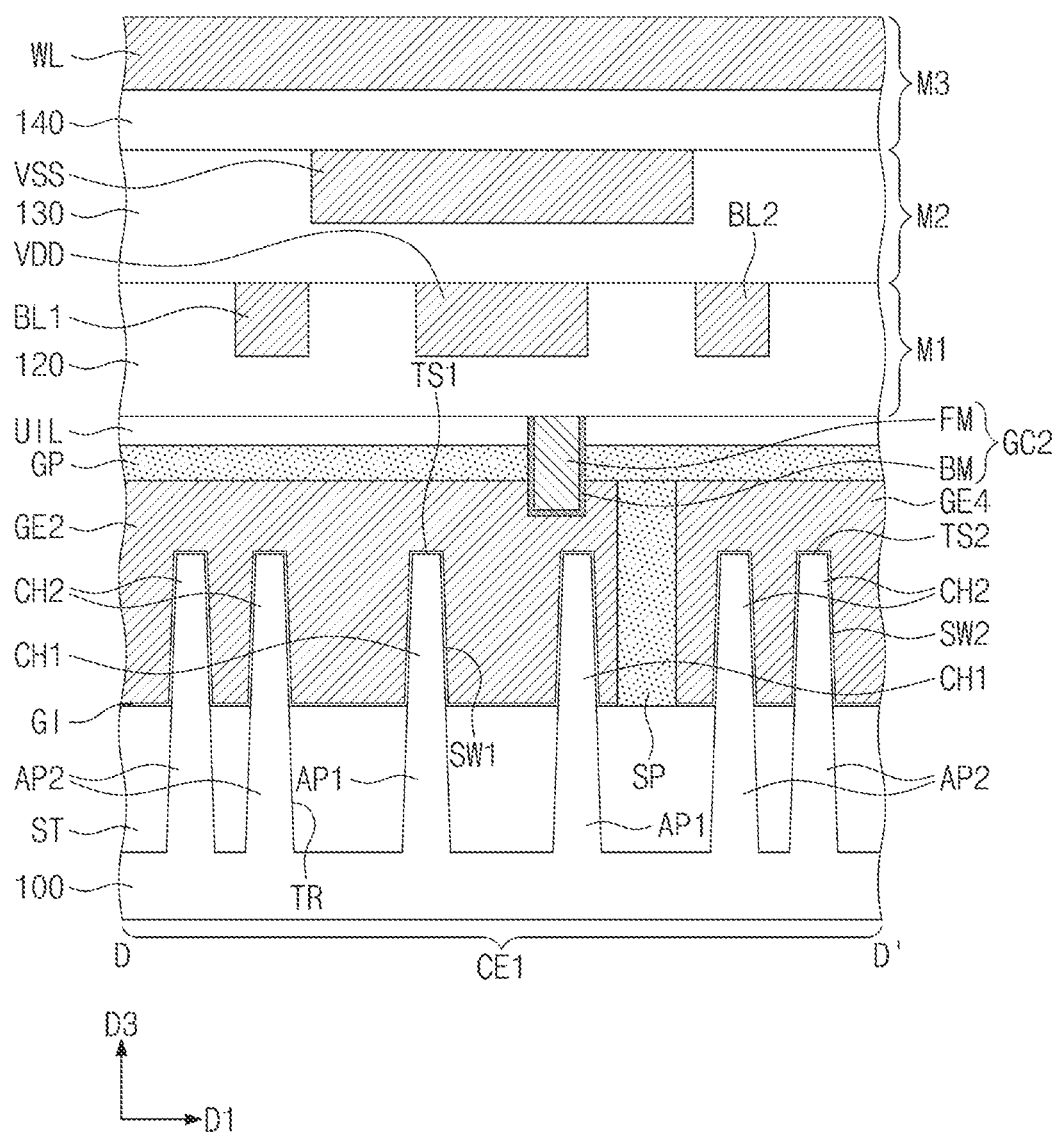
Figure 6A:
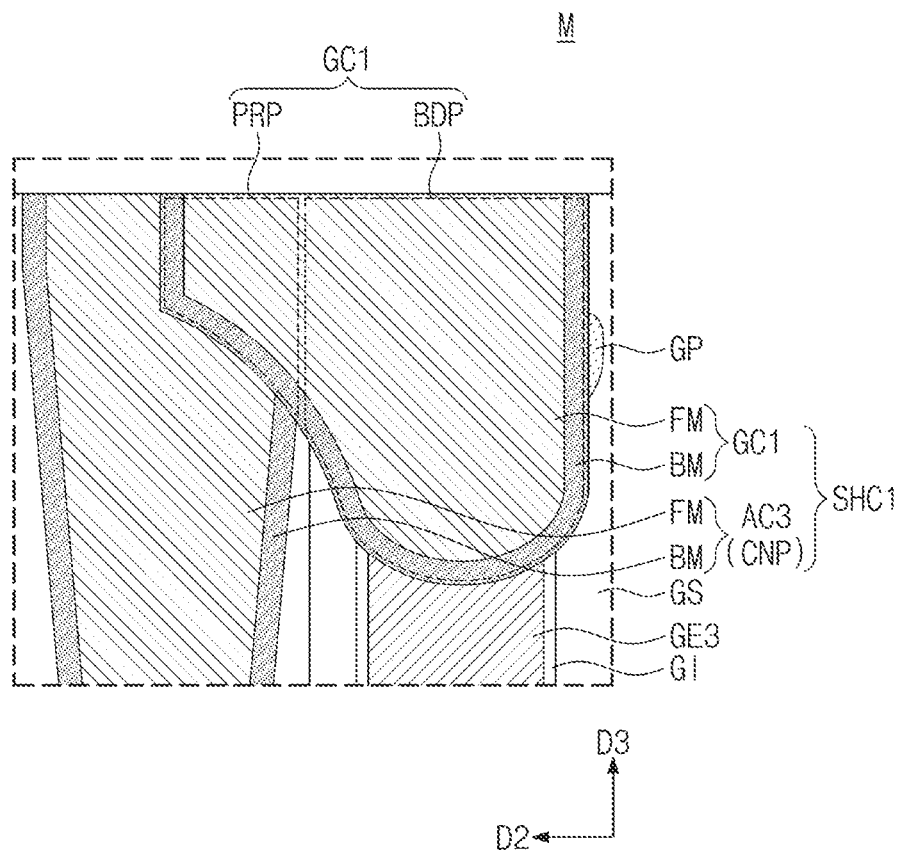
FIG. 6A is an enlarged sectional view of a portion 'M' of FIG. 5B.
Figure 6B:
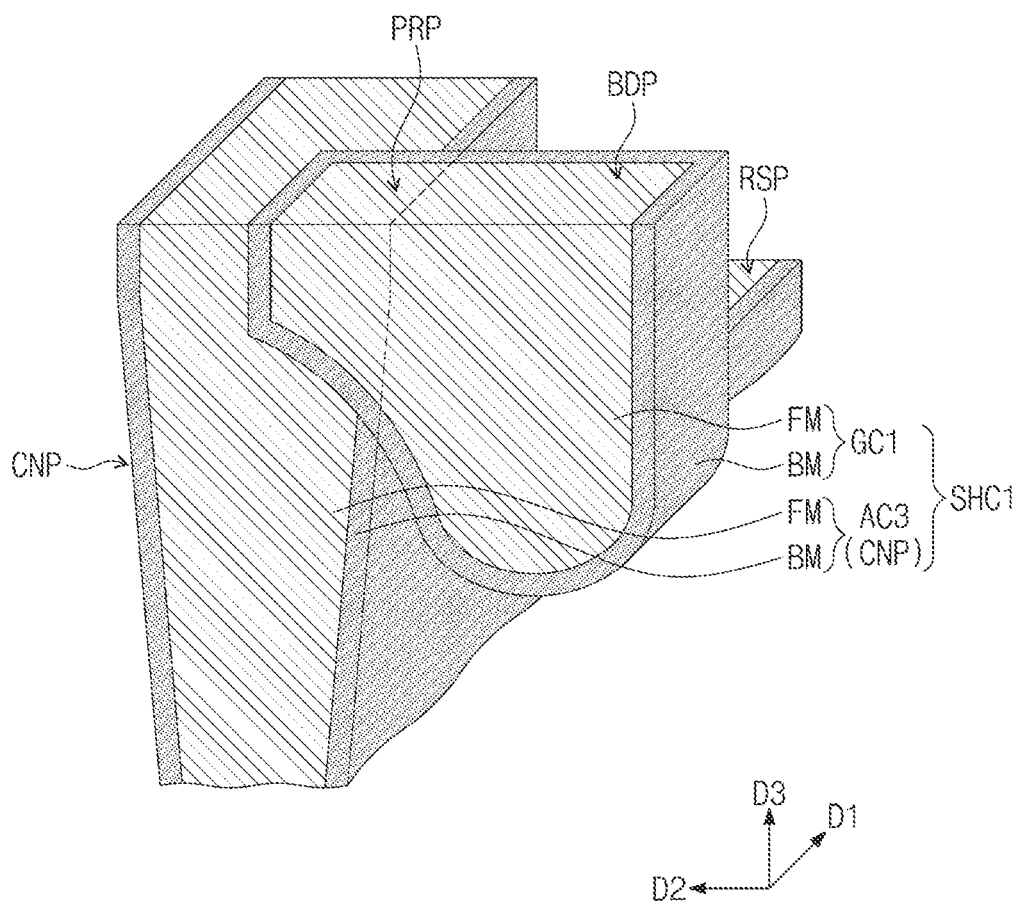
FIG. 6B is a perspective view schematically illustrating a first shared contact of FIG. 6A.

As best seen in FIGS. 5A and 5B, a pair of gate spacers GS may be on opposite side surfaces of the gate electrode GE. The pair of the gate spacers GS may extend along the gate electrode GE in the first direction D1. The pair of the gate spacers GS may have top surfaces that are higher than that of the gate electrode GE. The top surfaces of the pair of the gate spacers GS may be covered with a gate capping pattern GP, which will be described below.

The gate spacer GS may be formed of or include at least one of SiO, SiCN, SiCON, or SiN. Alternatively, the gate spacer GS may be a multi-layered structure including at least two of SiO, SiCN, SiCON, or SiN.

A gate insulating layer GI may be interposed between the gate electrode GE and the first and second active patterns AP1 and AP2. The gate insulating layer GI may extend along a bottom surface of the gate electrode GE. In some embodiments, the gate insulating layer GI may be interposed between the gate electrode GE and the gate spacers GS.

In some embodiments, the gate insulating layer GI may include a high-k dielectric layer or a combination of a silicon oxide layer and the high-k dielectric layer. The high-k dielectric layer may be formed of or include at least one high-k dielectric material whose dielectric constant is higher than that of silicon oxide. For example, the at least one high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In some embodiments, the semiconductor device may include a negative capacitance (NC) FET using a negative capacitor. For example, the gate insulating layer GI may include a ferroelectric layer that exhibits a ferroelectric property and a paraelectric layer that exhibits a paraelectric property.

The ferroelectric layer may have a negative capacitance, and the paraelectric layer may have a positive capacitance. When two or more capacitors are connected in series and each capacitor has a positive capacitance, a total capacitance may be reduced to a value that is less than a capacitance of each of the capacitors. By contrast, when at least one capacitor of a set of serially-connected capacitors has a negative capacitance, a total capacitance of the serially-connected capacitors may have a positive value and may be greater than an absolute value of each capacitance.

When a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which may be less than 60 mV/decade at room temperature.

The ferroelectric layer may have the ferroelectric property. The ferroelectric layer may be formed of or include at least one of hafnium oxide, hafnium zirconium oxide, barium strontium titanium oxide, barium titanium oxide, and/or lead zirconium titanium oxide, as examples. In some embodiments, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

When the ferroelectric layer includes hafnium oxide, the dopants in the ferroelectric layer may include at least one of, for example, gadolinium (Gd), silicon (Si), zirconium (Zr), aluminum (Al), and/or yttrium (Y).

When the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

When the dopants are silicon (Si), a content of silicon in the ferroelectric layer may range from 2 at % to 10 at %. When the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. When the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same material. The ferroelectric layer may have the ferroelectric property, but the paraelectric layer may not have the ferroelectric property. For example, when the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property only when its thickness is in a specific range. In some embodiments, the ferroelectric layer may have a thickness ranging from 0.5 to 10 nm, but the inventive concepts are not limited to this example. Since a critical thickness associated with the occurrence of the ferroelectric property may vary depending on the kind of the ferroelectric material, the thickness of the ferroelectric layer may be changed depending on the kind of the ferroelectric material.

In some embodiments, the gate insulating layer GI may include a single ferroelectric layer. In some embodiments, the gate insulating layer GI may include a plurality of ferroelectric layers that are spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and adjacent to the first and second channel patterns CH1 and CH2. The first metal pattern may include a work function metal that can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metallic material, which may be selected from the group consisting of titanium (Ti), tantalum (Ta), aluminum (Al), tungsten (W) and molybdenum (Mo), and nitrogen (N). The first metal pattern may further include carbon (C). The first metal pattern may include a plurality of work function metal layers, which may be stacked on top of each other.

The second metal pattern may include a metallic material whose resistance is lower than the first metal pattern. For example, the second metal pattern may include at least one metallic material, which may be selected from the group consisting of tungsten (W), aluminum (Al), titanium (Ti), and tantalum (Ta).

As seen in FIG. 5D, the second gate electrode GE2 may be provided on a first top surface TS1 of the first channel pattern CH1 and at least one first side surface SW1 of the first channel pattern CH1. The fourth gate electrode GE4 may be provided on a second top surface TS2 of the second channel pattern CH2 and at least one second side surface SW2 of the second channel pattern CH2. In other words, the transistor according to the present embodiment may be a three-dimensional field-effect transistor (e.g., FinFET), in which the gate electrode is provided to three-dimensionally surround the channel patterns.

The gate capping patterns GP may be provided on the gate electrodes GE, with each gate capping pattern GP provided on a respective gate electrode GE. The gate capping pattern GP may extend along the gate electrode GE in the first direction D1. The gate capping pattern GP may be formed of or include at least one of materials that are chosen to have an etch selectivity with respect to first to fourth interlayer insulating layers 110, 120, 130, and 140, which will be described below. For example, the gate capping patterns GP may be formed of or include at least one of SiON, SiCN, SiCON, or SiN.

The first interlayer insulating layer 110 may be provided on the substrate 100. The first interlayer insulating layer 110 may cover the gate spacers GS and the first and second source/drain patterns SD1 and SD2.

The first interlayer insulating layer 110 may include a lower insulating layer LIL and an upper insulating layer UIL. The upper insulating layer UIL may cover the gate capping patterns GP and a recess portion RSP of an active contact AC, which will be described below. The upper insulating layer UIL may be formed of or include an insulating material that is the same as or different from the lower insulating layer LIL. For example, the lower insulating layer LIL may be formed of or include SiO, and the upper insulating layer UIL may be formed of or include SiO, SiOC, or SiC.

The active contacts AC may be provided to penetrate or extend through the first interlayer insulating layer 110 and may be coupled to the first and second source/drain patterns SD1 and SD2. The active contacts AC may have top surfaces that are coplanar with the top surface of the first interlayer insulating layer 110. In some embodiments, the active contacts AC may include first to eighth active contacts AC1 to AC8 on the first bit cell CE1.

The active contact AC may be a self-aligned contact. In other words, the active contact may be formed by a self-aligned method using the gate capping pattern GP and the gate spacer GS. For example, the active contact AC may cover at least a portion of a side surface of the gate capping pattern GP.

Figure 5E:
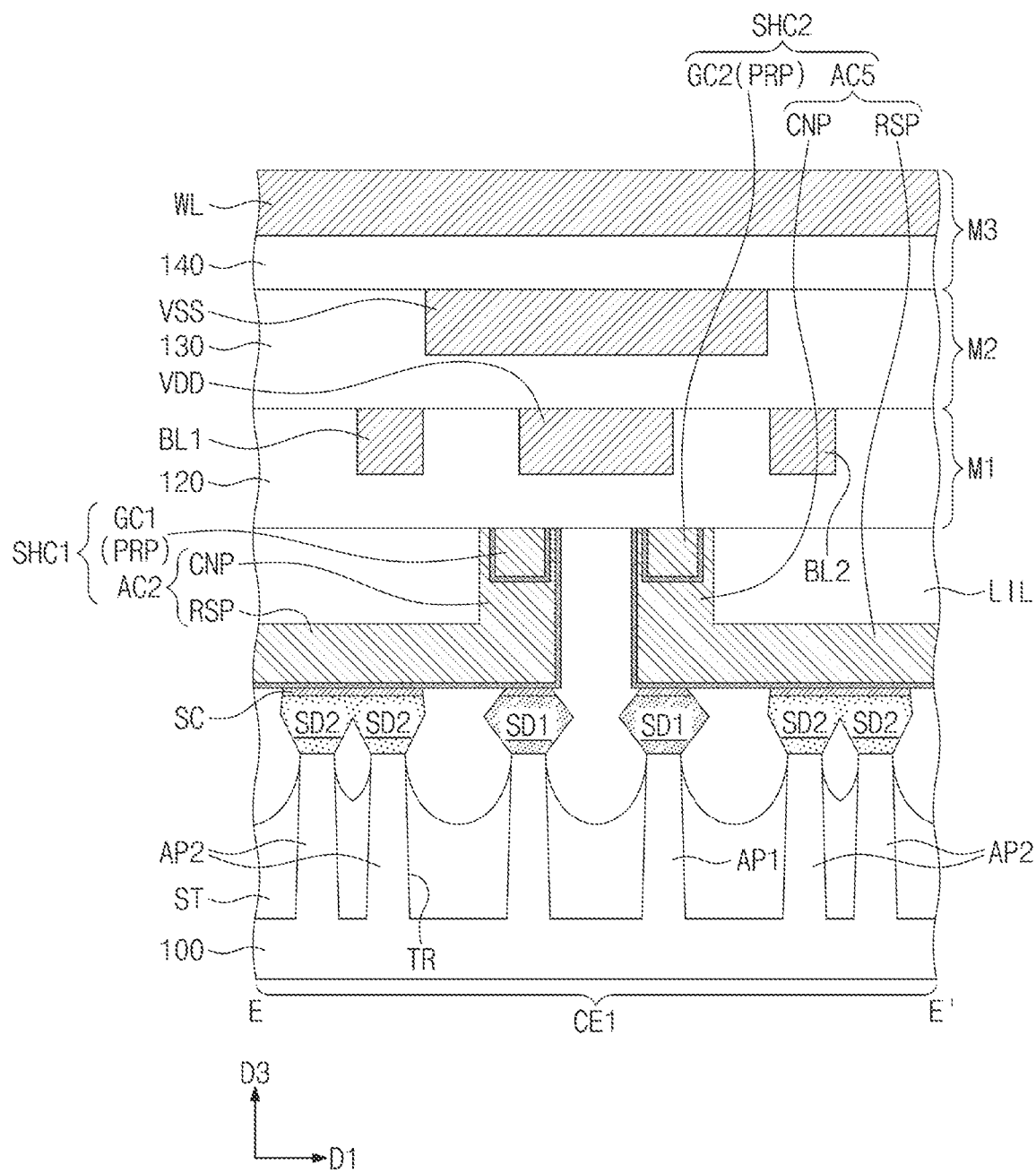

As seen in FIGS. 5C and 5E, the active contact AC may include a connecting portion CNP and a recess portion RSP.

A top surface of the connecting portion CNP of the active contact AC may be higher than a top surface of the recess portion RSP. The top surface of the connecting portion CNP of the active contact AC may be coplanar with the top surface of the first interlayer insulating layer 110. The upper insulating layer UIL may be provided on the top surface of the recess portion RSP of the active contact AC.

A first via VI1 may be on the connecting portion CNP. In other words, the connecting portion CNP may extend in a vertical direction (i.e., the third direction D3) and may be in contact with the first via VI1. The active contact AC may be electrically connected to the first interconnection layer M1 through the connecting portion CNP and the first via VI1.

The connecting portion CNP of the second active contact AC2 may be in contact with a first gate contact GC1 (as seen in FIG. 5B). The second active contact AC2 may be electrically connected to the first gate contact GC1 through the connecting portion CNP. The connecting portion CNP of the fifth active contact AC5 may be in contact with a second gate contact GC2 (as seen in FIG. 5B). The fifth active contact AC5 may be electrically connected to the second gate contact GC2 through the connecting portion CNP.

A silicide pattern SC may be interposed between the active contact AC and the source/drain pattern SD1 or SD2, which are connected thereto. In other words, the active contact AC may be electrically connected to the source/drain pattern SD1 or SD2 via the silicide pattern SC. The silicide pattern SC may be formed of or include at least one of metal silicide materials (e.g., titanium silicide, tantalum silicide, tungsten silicide, nickel silicide, or cobalt silicide).

A gate contact GC may be provided on and electrically connected to the gate electrode GE. The gate contact GC may penetrate or extend through the first interlayer insulating layer 110, the gate spacers GS, and the gate capping pattern GP, and the gate contact GC may be coupled to the gate electrode GE.

A top surface of the gate contact GC and a top surface of the connecting portion CNP of the active contact AC may be coplanar with the top surface of the first interlayer insulating layer 110. A bottom surface of the gate contact GC may be higher than the bottom surface of the active contact AC. The bottom surface of the gate contact GC may be higher than the top surface of the recess portion RSP of the active contact AC and may be lower than the top surface of the connecting portion CNP.

Each of the active contacts AC and gate contacts GC may include a conductive pattern FM and a barrier pattern BM that encloses the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. The barrier pattern BM may include a metal nitride layer or may have a structure including a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

The gate contacts GC may include the first and second gate contacts GC1 and GC2 on the first bit cell CE1. The first gate contact GC1 may be coupled to the third gate electrode GE3, and the second gate contact GC2 may be coupled to the second gate electrode GE2.

As seen in FIGS. 4 and 5B, the first gate contact GC1 and the second active contact AC2, which are in contact with each other on the first bit cell CE1, may constitute a first shared contact SHC1. The third gate electrode GE3 may be electrically connected to the first source/drain pattern SD1, which is adjacent thereto, through the first shared contact SHC1 (e.g., through the first gate contact GC1 and the second active contact AC2). The second gate contact GC2 and the fifth active contact AC5, which are in contact with each other, may constitute a second shared contact SHC2.

The second interlayer insulating layer 120, the third interlayer insulating layer 130, and the fourth interlayer insulating layer 140 may be sequentially stacked on the first interlayer insulating layer 110. In some embodiments, the second to fourth interlayer insulating layers 120, 130, and 140 may be formed of or include silicon oxide.

The first interconnection layer M1 may be provided in the second interlayer insulating layer 120. The first interconnection layer M1 may include the first bit line BL1, the second bit line BL2, the power line VDD, the first lower landing pad LLP1, the second lower landing pad LLP2, and the first vias VI1, as previously described with reference to FIG. 2.

The second interconnection layer M2 may be provided in the third interlayer insulating layer 130. The second interconnection layer M2 may include the ground line VSS, the upper landing pad ULP, and the second vias VI2, as previously described with reference to FIG. 2.

The third interconnection layer M3 may be provided in the fourth interlayer insulating layer 140. The third interconnection layer M3 may include the word lines WL and the third vias VI3, as previously described with reference to FIG. 2.

In the first bit cell CE1, the first and second active patterns AP1 and AP2 with the first to fourth gate electrodes GE1 to GE4 may constitute memory transistors. The memory transistors of the first bit cell CE1 may include the first pull-up transistor TU1, the first pull-down transistor TD1, the second pull-up transistor TU2, the second pull-down transistor TD2, the first pass-gate transistor TA1, and the second pass-gate transistor TA2 previously described with reference to FIG. 1.

The first gate electrode GE1 may serve as the gate of the first pass-gate transistor TA1. The first gate electrode GE1 may be electrically connected to the word line WL. The second gate electrode GE2 may serve as a common gate of the first pull-down and first pull-up transistors TD1 and TU1. The third gate electrode GE3 may serve as a common gate of the second pull-down and second pull-up transistors TD2 and TU2. The fourth gate electrode GE4 may serve as the gate of the second pass-gate transistor TA2. The fourth gate electrode GE4 may be electrically connected to the word line WL.

The first active contact AC1 may be electrically connected to the second source/drain of the first pull-down transistor TD1. The first active contact AC1 may be electrically connected to the ground line VSS.

The second active contact AC2 may be electrically connected to a common source/drain (e.g., the first source/drain) of the first pull-down transistor TD1 and the first pass-gate transistor TA1. The second active contact AC2 may extend in the first direction D1 and may be electrically connected to the first source/drain of the first pull-up transistor TU1.

The first gate contact GC1 and the second active contact AC2 may constitute the first shared contact SHC1. The second active contact AC2 and the third gate electrode GE3 may be electrically connected to each other through the first shared contact SHC1. In other words, the common source/drain of the first pull-up and first pull-down transistors TU1 and TD1 may be electrically connected to the common gate of the second pull-up and second pull-down transistors TU2 and TD2 through the first shared contact SHC1. The first shared contact SHC1 may correspond to the first node N1 of FIG. 1.

The third active contact AC3 may be electrically connected to the second source/drain of the first pass-gate transistor TA1. The third active contact AC3 may be electrically connected to the first bit line BL1 through the first via VI1 (as seen in FIG. 5A).

The fourth active contact AC4 may be electrically connected to the second source/drain of the first pull-up transistor TU1. The fourth active contact AC4 may be electrically connected to the power line VDD through the first via VI1 (as seen in FIG. 5B).

The fifth active contact AC5 may be electrically connected to the first source/drain of the second pull-up transistor TU2. The fifth active contact AC5 may extend in the first direction D1 and may be electrically connected to a common source/drain (e.g., the first source/drain) of the second pull-down transistor TD2 and the second pass-gate transistor TA2.

The second gate contact GC2 and the fifth active contact AC5 may constitute a second shared contact SHC2. The fifth active contact AC5 and the second gate electrode GE2 may be electrically connected to each other through the second shared contact SHC2. In other words, the common source/drain of the second pull-up and second pull-down transistors TU2 and TD2 may be electrically connected to the common gate of the first pull-up and first pull-down transistors TU1 and TD1 through the second shared contact SHC2. The second shared contact SHC2 may correspond to the second node N2 of FIG. 1.

The sixth active contact AC6 may be electrically connected to the second source/drain of the second pull-up transistor TU2. The sixth active contact AC6 may be electrically connected to the power line VDD through the first via VI1 (as seen in FIG. 5C).

The seventh active contact AC7 may be electrically connected to the second source/drain of the second pass-gate transistor TA2. The seventh active contact AC7 may be electrically connected to the second bit line BL2 through the first via VI1.

The eighth active contact AC8 may be electrically connected to the second source/drain of the second pull-down transistor TD2. The eighth active contact AC8 may be electrically connected to the ground line VSS.

Referring to FIGS. 6A and 6B, each of the first gate contact GC1 and the second active contact AC2 of the first shared contact SHC1 may include the barrier pattern BM and the conductive pattern FM. The barrier pattern BM of the first gate contact GC1 may be interposed between the conductive pattern FM of the first gate contact GC1 and the conductive pattern FM of the second active contact AC2.

The first gate contact GC1 may include a body portion BDP that is coupled to the third gate electrode GE3, and a protruding portion PRP that protrudes from the body portion BDP in the second direction D2 (e.g., horizontally). The protruding portion PRP may overlap the second active contact AC2. The body portion BDP may not overlap the second active contact AC2, or in other words may be offset from the second active contact AC2. The protruding portion PRP may be in direct contact with the second active contact AC2. In other words, the first gate contact GC1 may be connected to the second active contact AC2 through the barrier pattern BM and the conductive pattern FM of the protruding portion PRP.

The protruding portion PRP may extend from the body portion BDP toward a central portion of the second active contact AC2. The protruding portion PRP may enter into an upper portion of the second active contact AC2. The protruding portion PRP may have a shape that is buried or inserted in the second active contact AC2.

The protruding portion PRP may be located at a level that is higher than a bottom surface of the body portion BDP. In other words, the lowermost portion of the protruding portion PRP may be higher than the top surface of the third gate electrode GE3. In some embodiments, a top surface of the protruding portion PRP may be coplanar with a top surface of the body portion BDP. In some embodiments, the top surface of the protruding portion PRP may be lower than the top surface of the body portion BDP.

Since the protruding portion PRP of the first gate contact GC1 has a structure that is buried or inserted in the second active contact AC2, a contact area between the first gate contact GC1 and the second active contact AC2 may be relatively increased. Accordingly, a contact resistance between the first gate contact GC1 and the second active contact AC2 may be relatively reduced.

The protruding portion PRP of the first gate contact GC1 may overlap the second active contact AC2. Due to this structure of the protruding portion PRP, it may be possible to secure an alignment margin between the first gate contact GC1 and the second active contact AC2 when the first gate contact GC1 is formed. In other words, due to the protruding portion PRP, it may be possible to prevent a misalignment issue from occurring between the first gate contact GC1 and the second active contact AC2. This may make it possible to improve the reliability of the semiconductor memory device.

Figure 7:
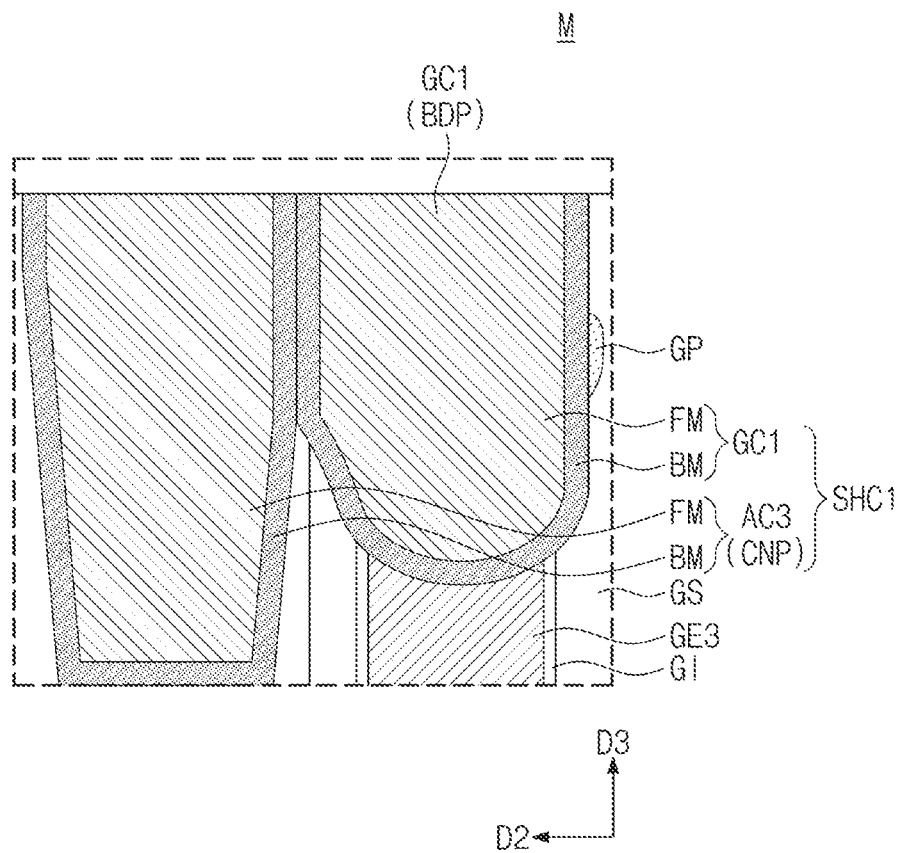
FIG. 7 is an enlarged sectional view illustrating a portion of a comparative device, the portion corresponding to the portion 'M' of FIG. 5B.
Figure 8A:
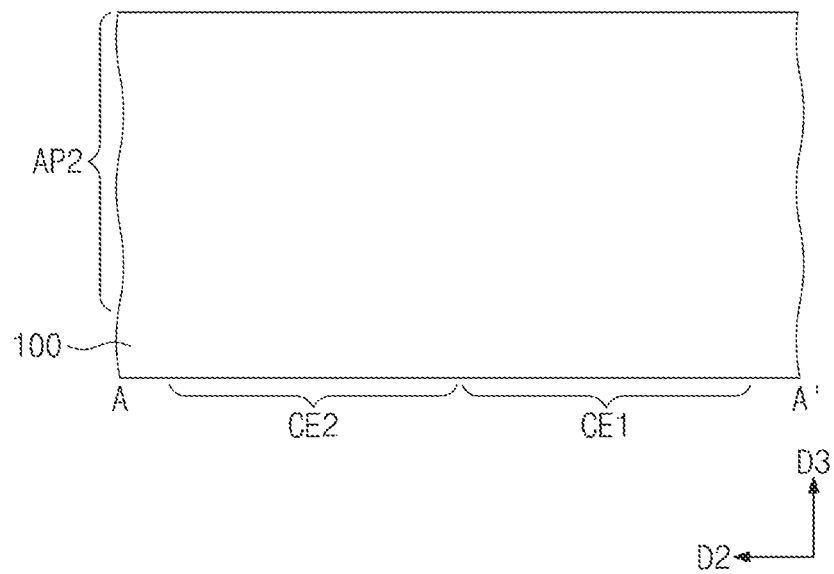
FIGS. 8A to 12D are sectional views illustrating operations of a method of fabricating a semiconductor memory device, according to some embodiments of the inventive concepts.
Figure 8B:
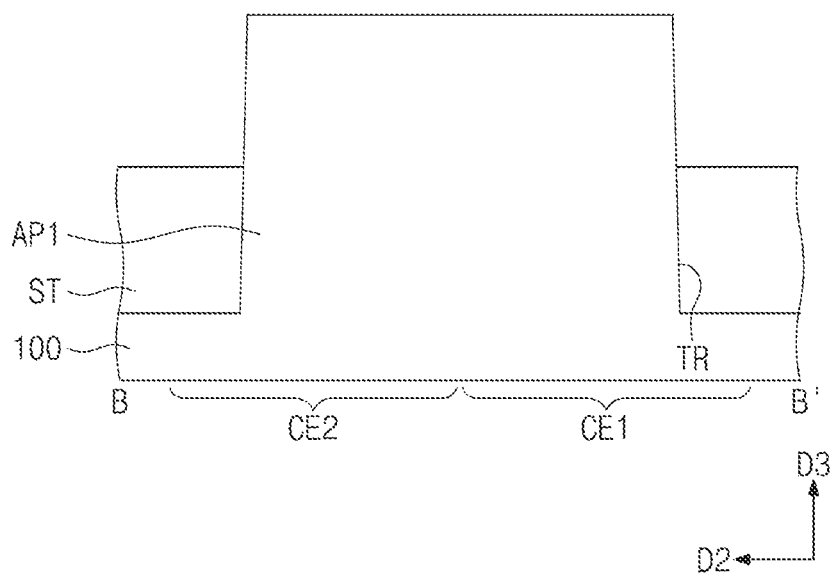
Figure 8C:
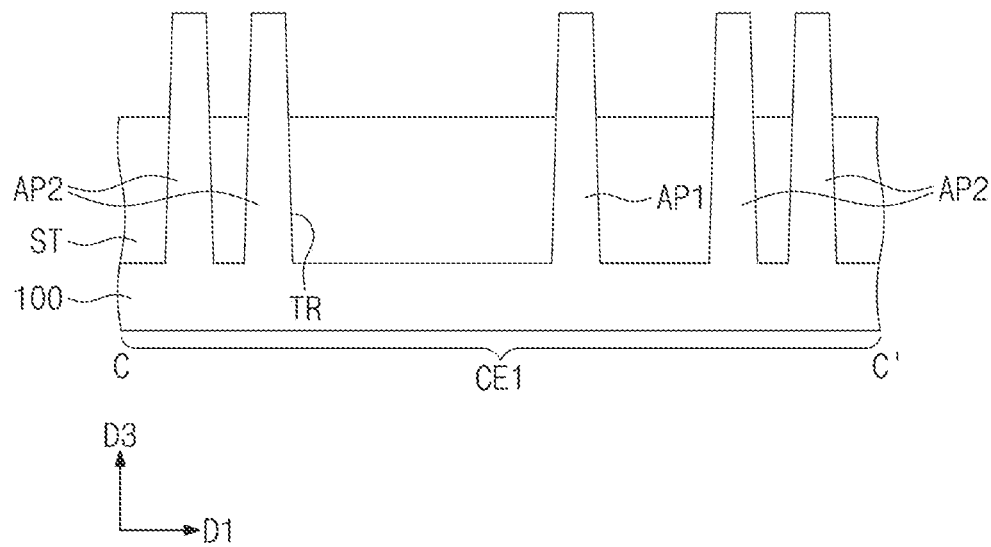
Figure 8D:
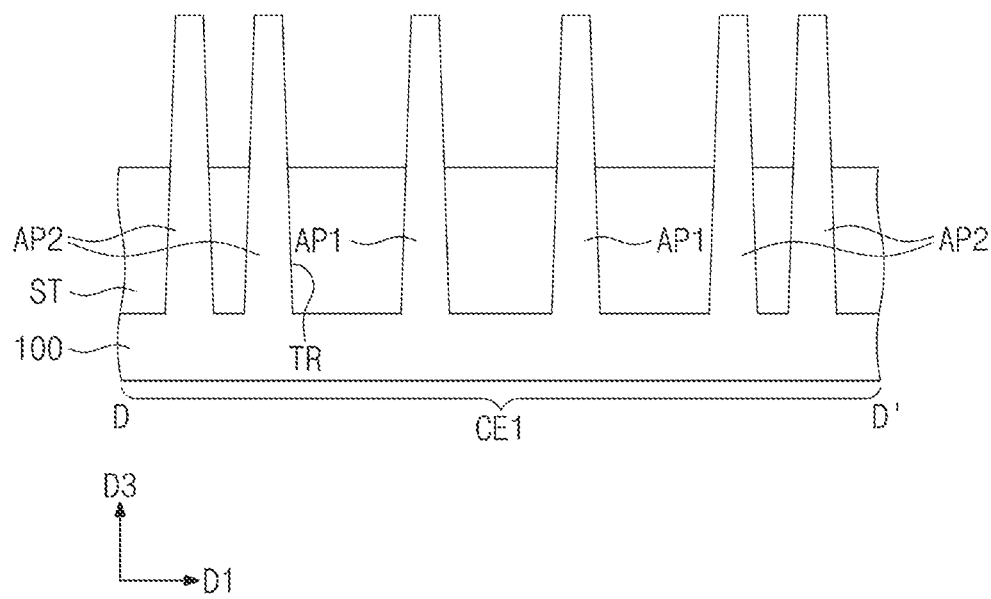
Figure 9A:
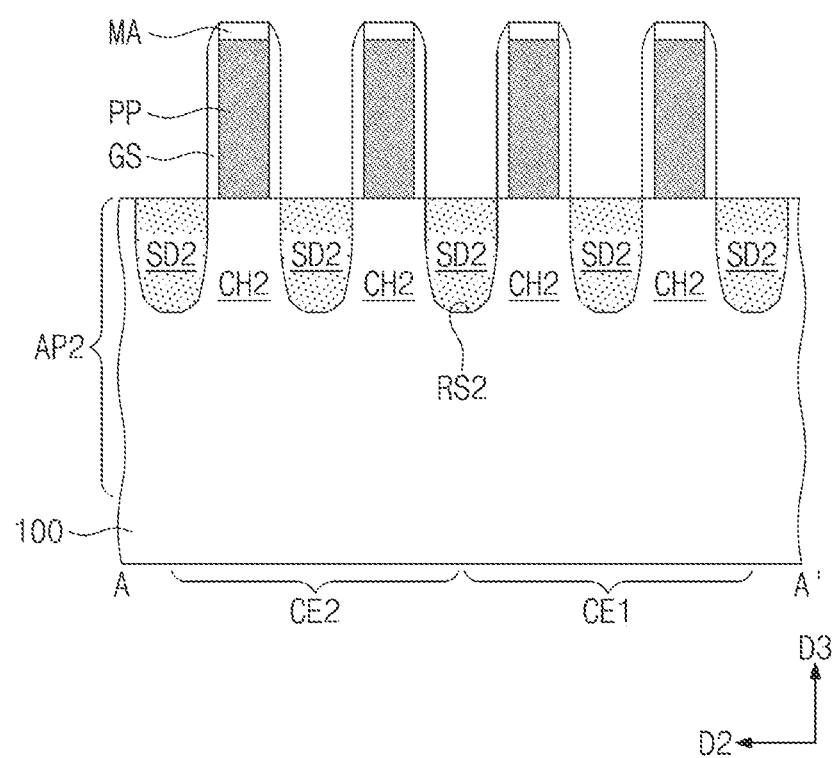
Figure 9B:
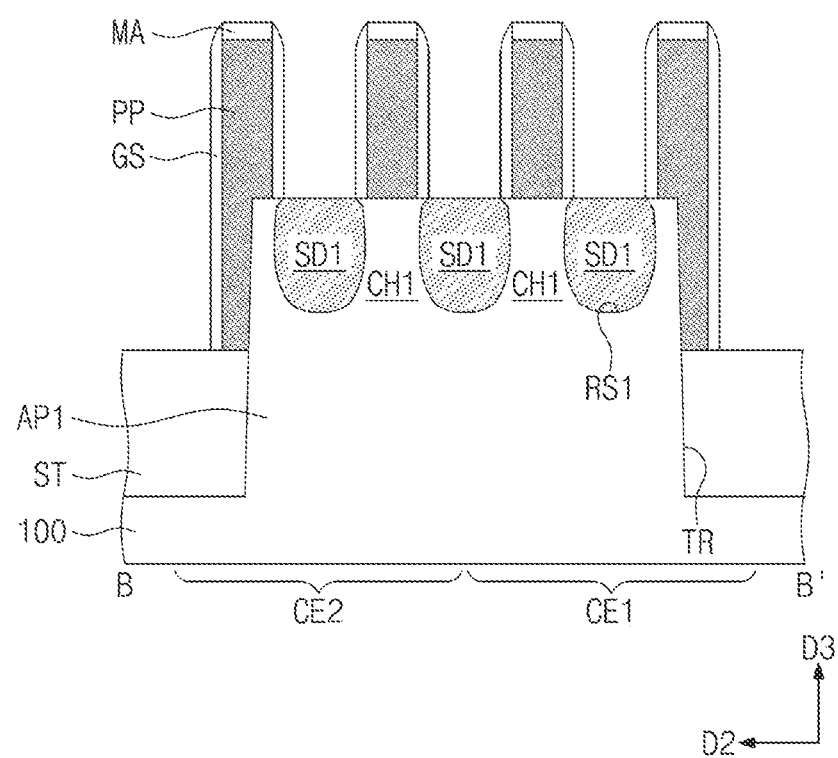
Figure 9C:
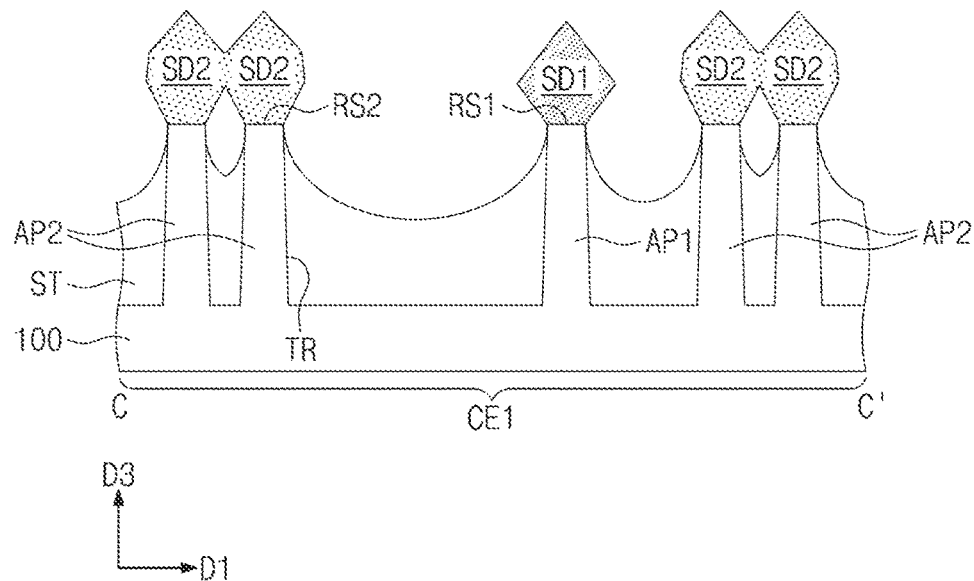
Figure 9D:
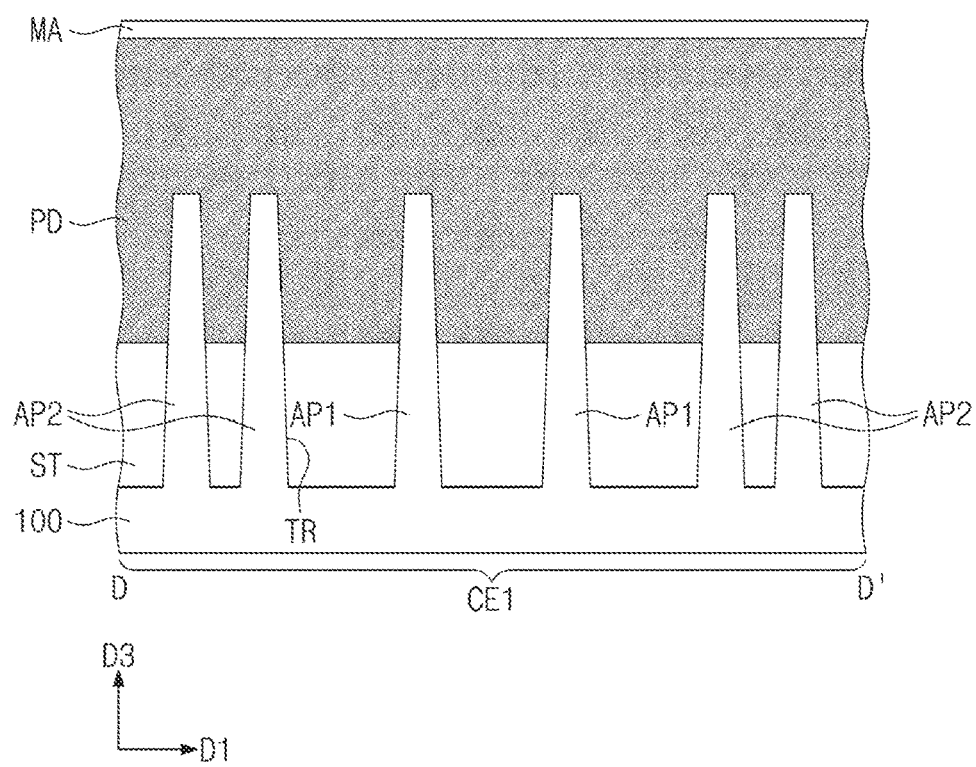
Figure 10A:
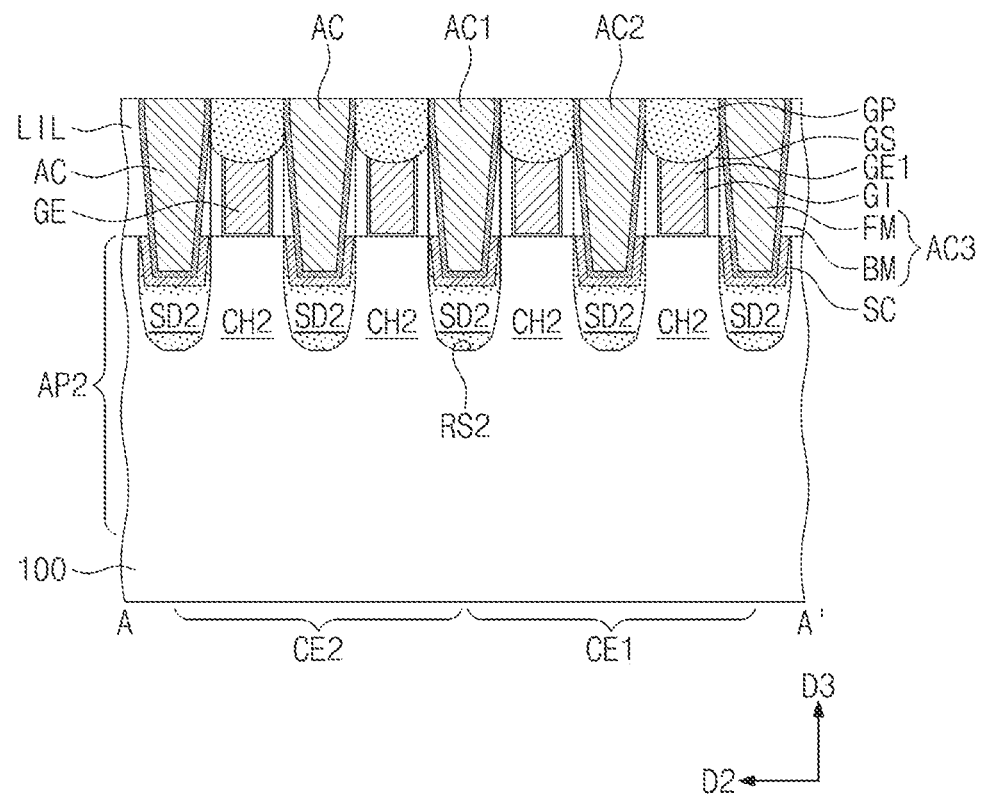
Figure 10B:
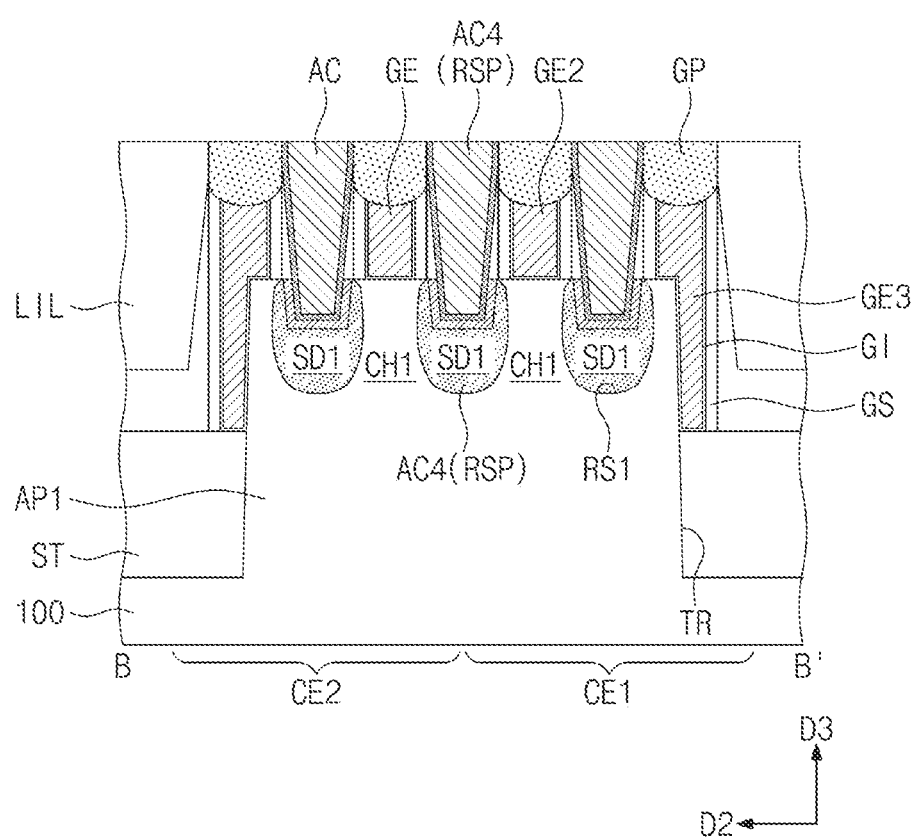
Figure 10C:
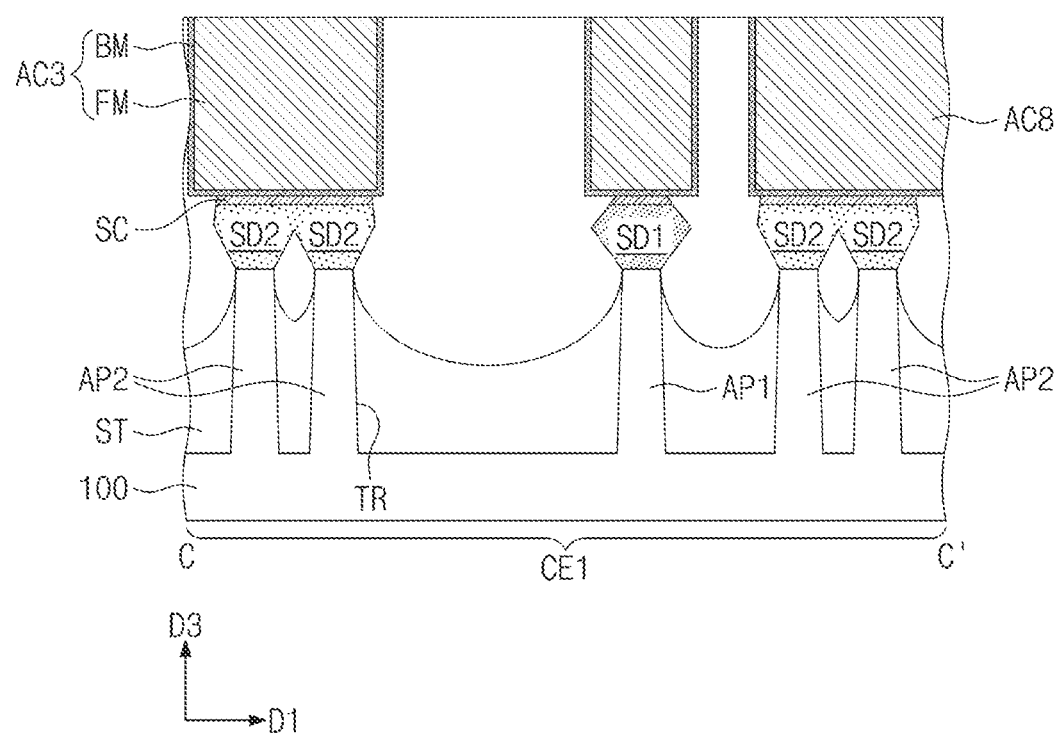
Figure 10D:
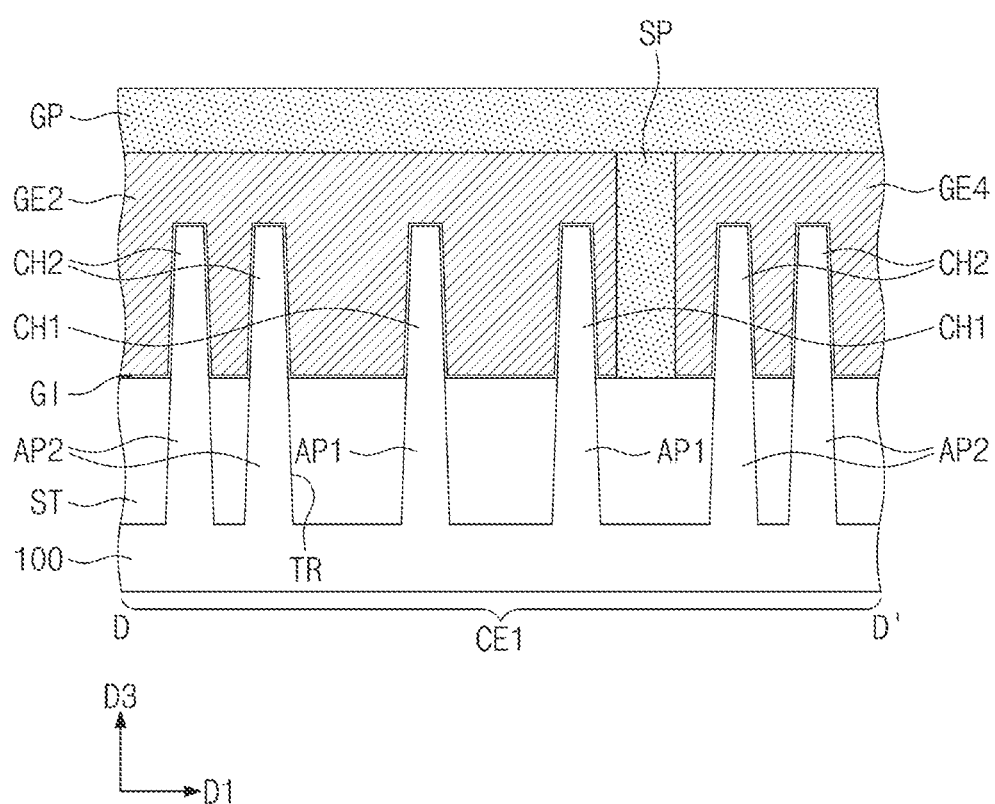
Figure 11A:
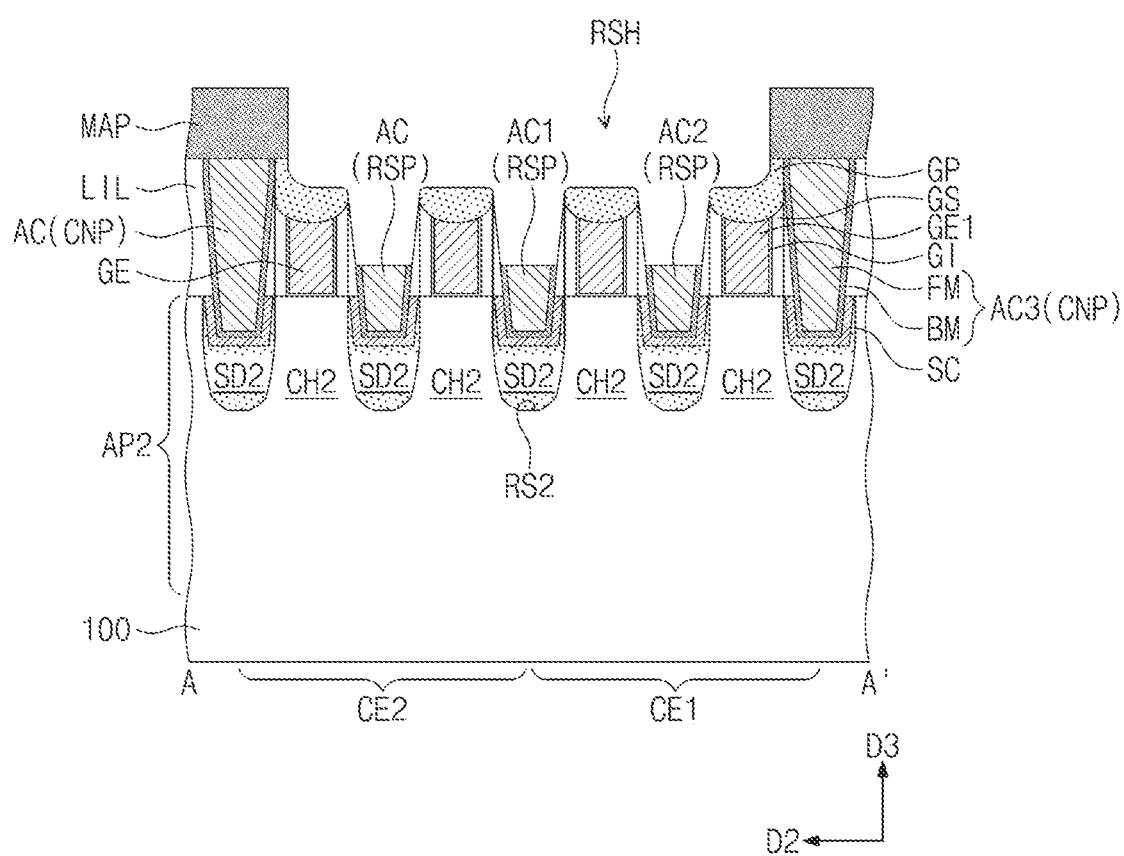
Figure 11B:
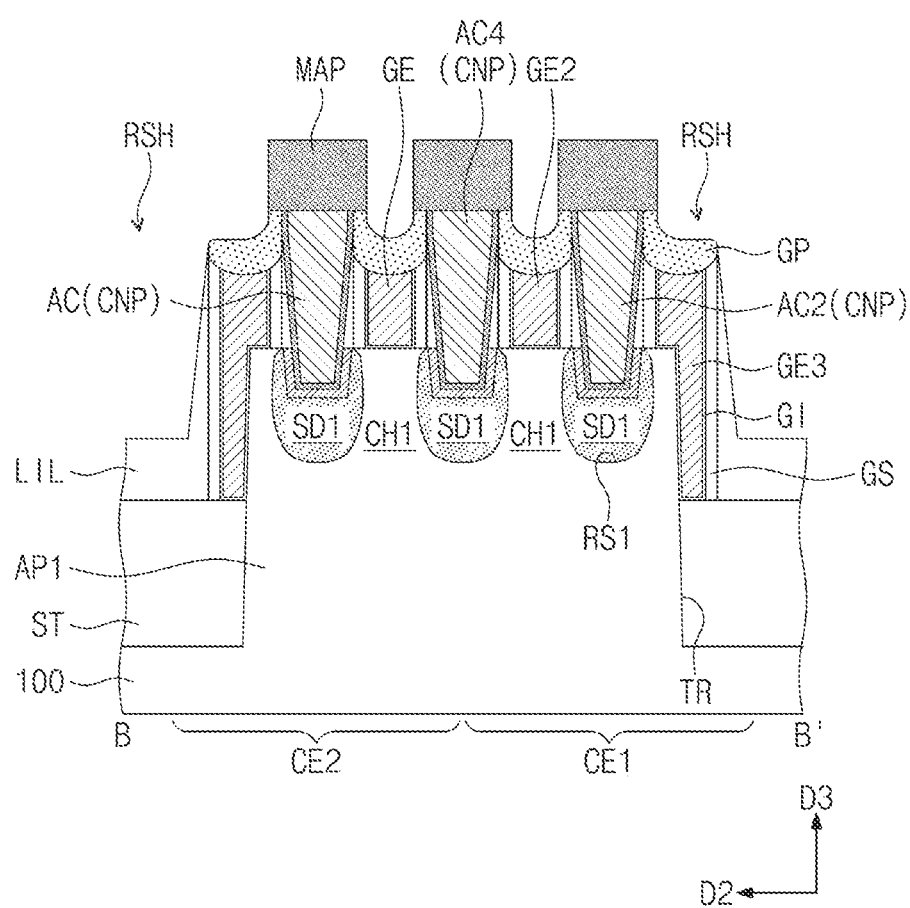
Figure 11C:
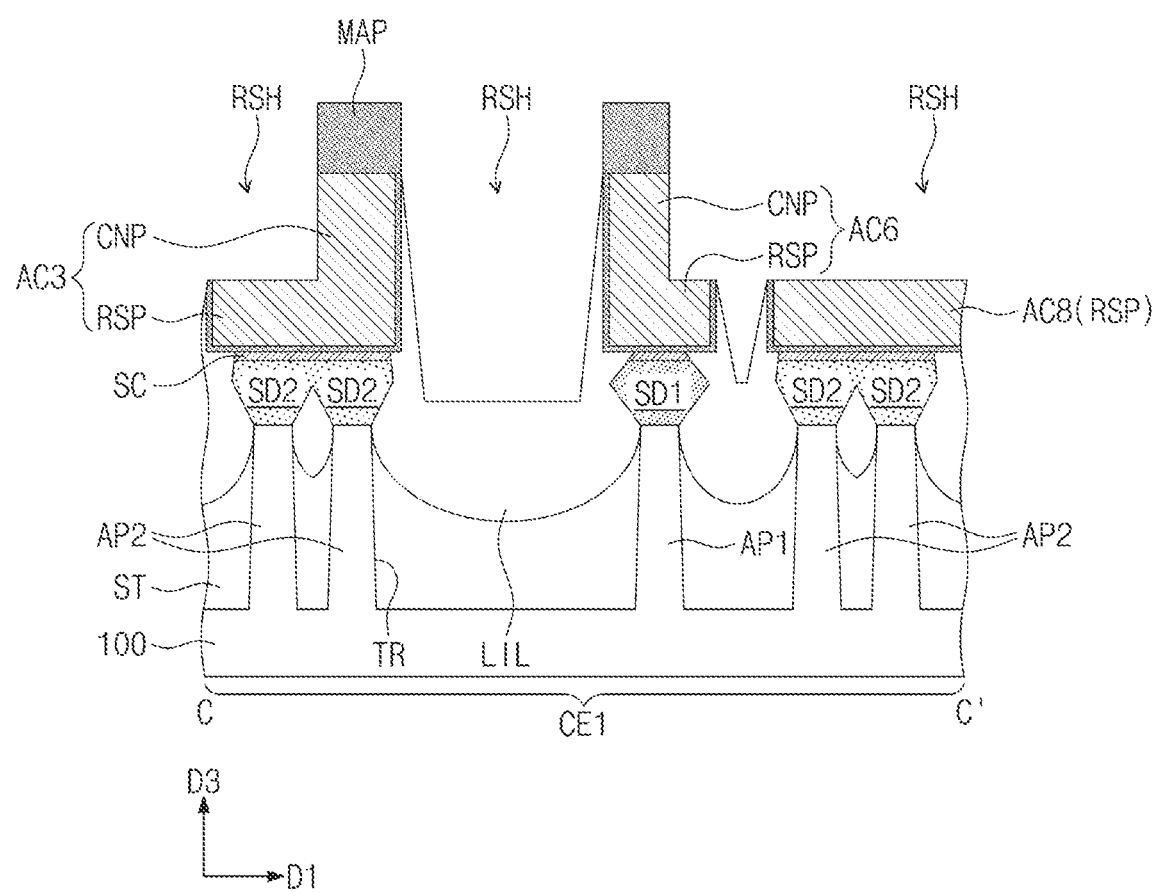
Figure 11D:
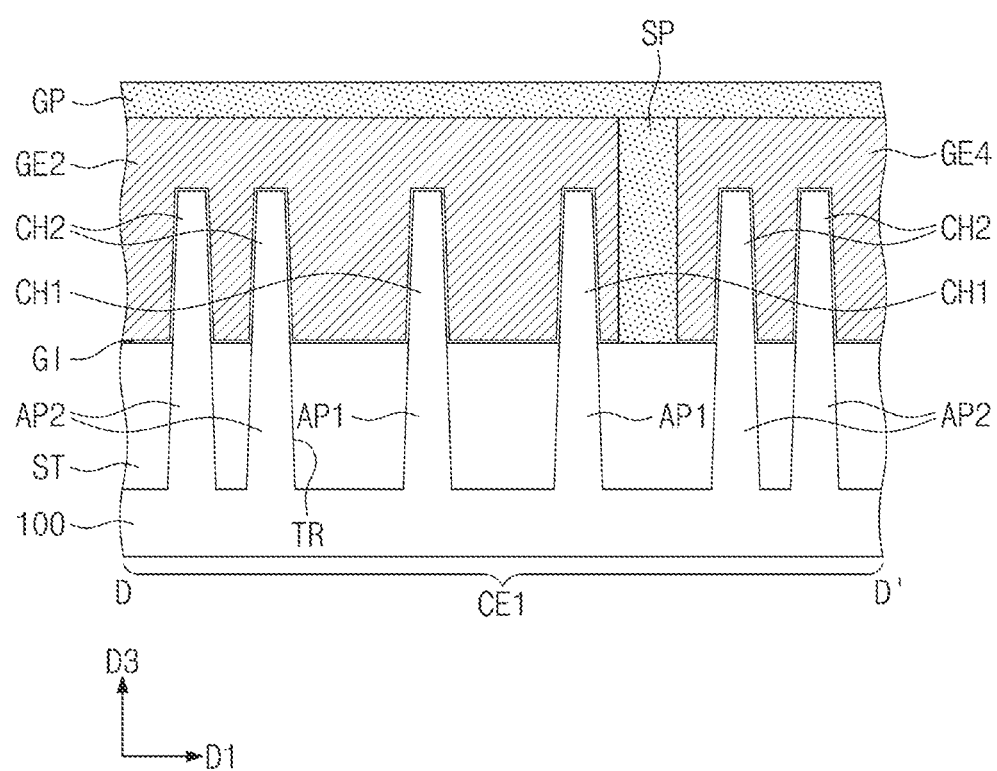
Figure 12A:
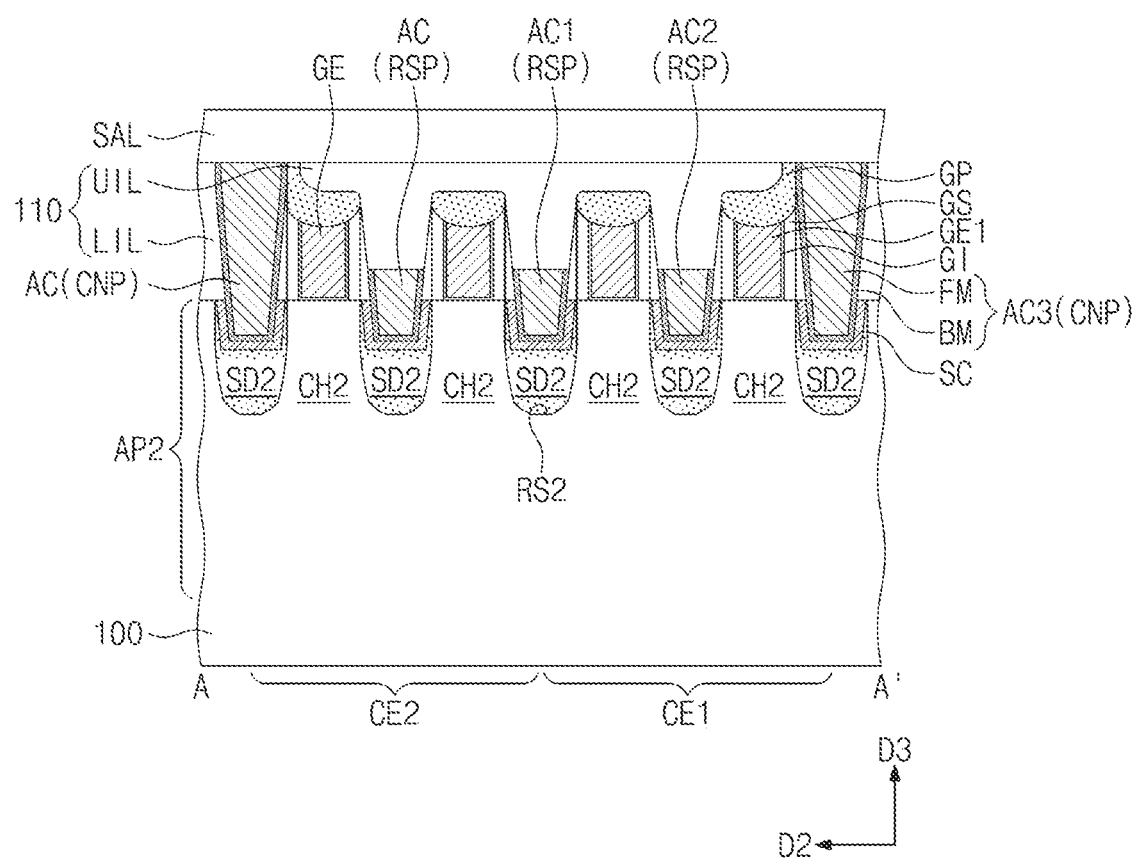
Figure 12B:
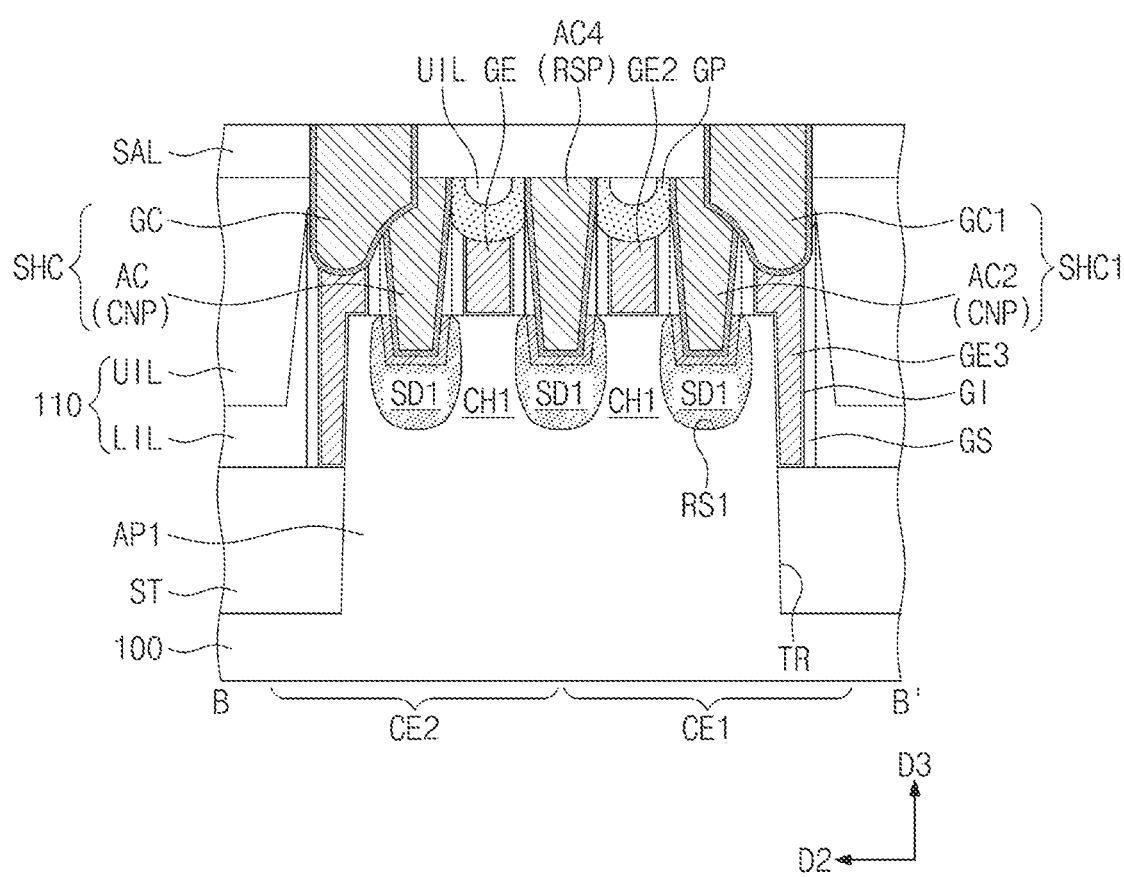
Figure 12C:
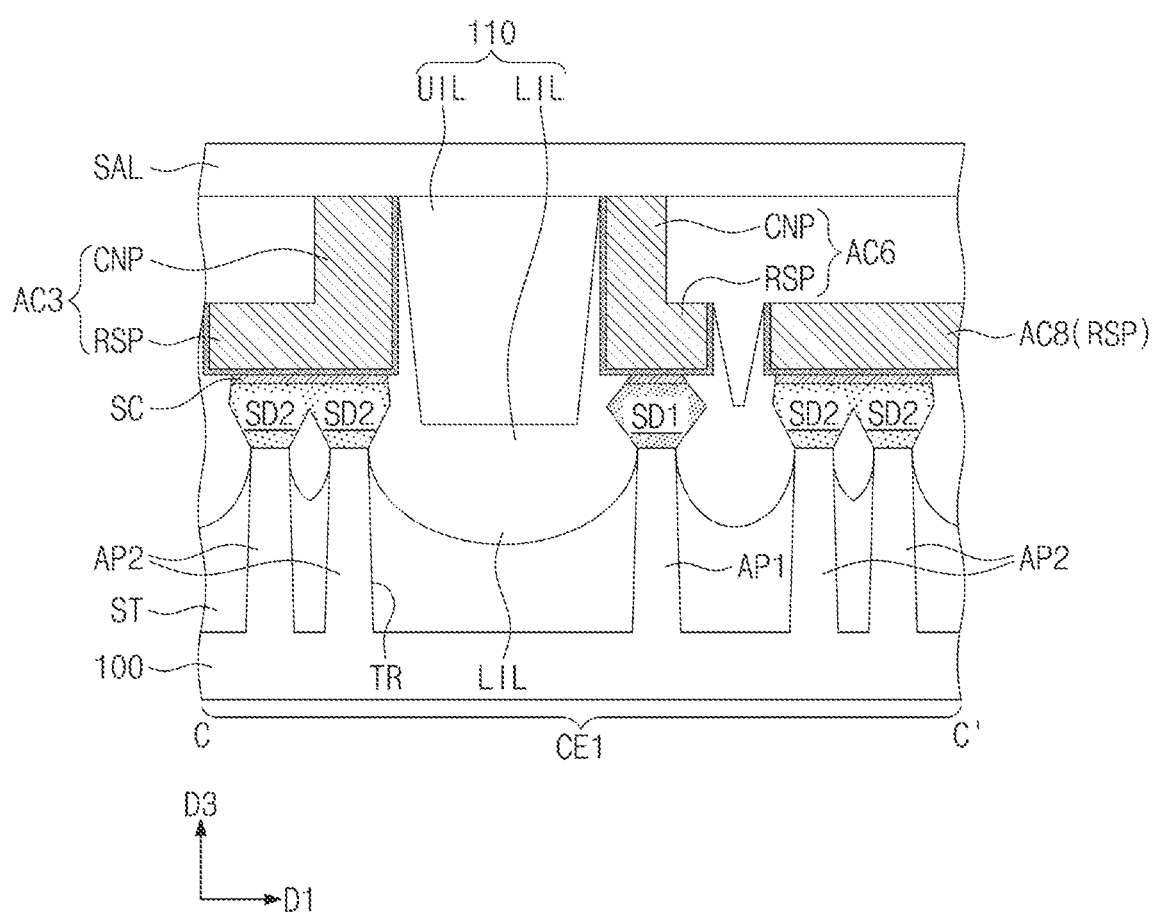
Figure 12D:
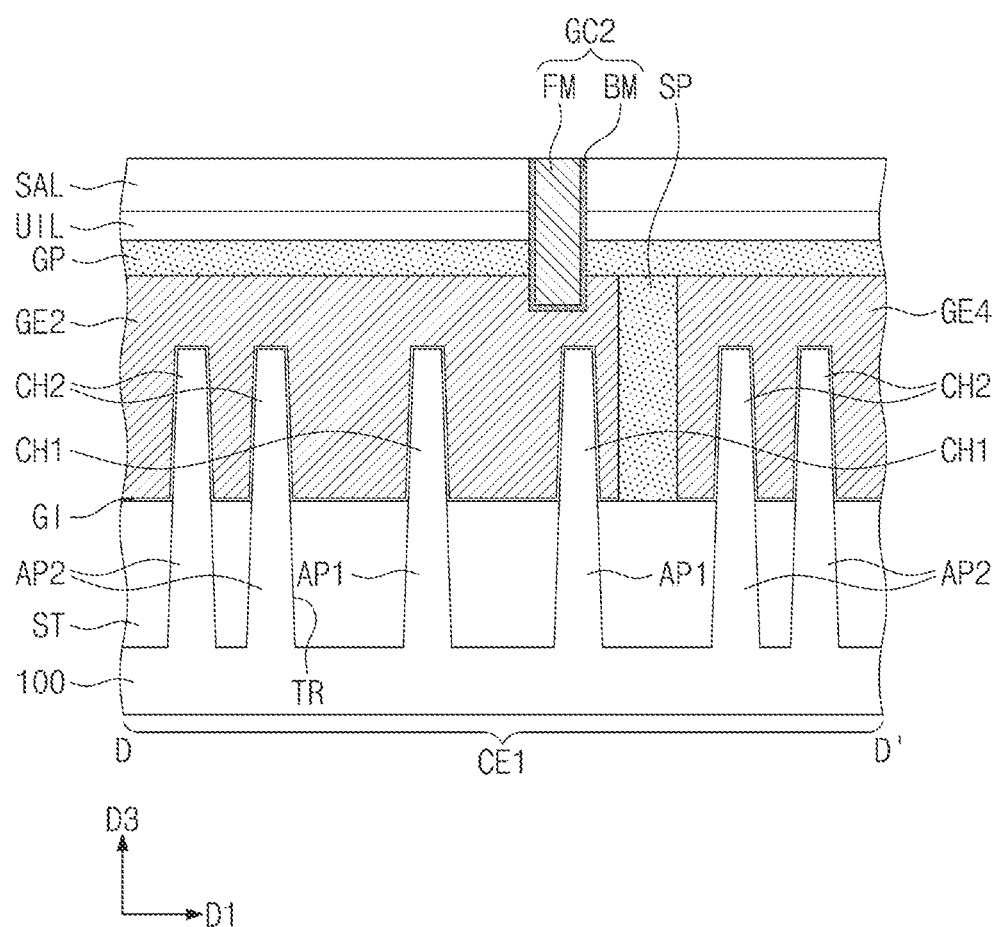

FIG. 7 is an enlarged sectional view illustrating a portion of a comparative structure, with the illustrated portion corresponding to the portion 'M' of FIG. 5B. Referring to FIG. 7, the first gate contact GC1 may not include the protruding portion PRP of FIG. 6. In other words, the first gate contact GC1 may be composed of only the body portion BDP. An upper side surface of the first gate contact GC1 may be in contact with an upper side surface of the second active contact AC2 in a two-dimensional or surface-to-surface contact manner. In this case, a contact area between the first gate contact GC1 and the second active contact AC2 may be relatively small. Accordingly, a contact resistance between the first gate contact GC1 and the second active contact AC2 may have a relatively high value.

According to some embodiments of the inventive concepts, the gate contact GC and the active contact AC may be provided to be in contact with each other in a three-dimensional contact manner, not in a two-dimensional or planar contact manner, and the gate contact GC and the active contact AC may constitute a single shared contact SHC. This may make it possible to reduce an electric resistance of the shared contact SHC (e.g., the first node N1) and to improve operational and electric characteristics (e.g., an operation speed) of the SRAM cell.

FIGS. 8A to 12D are sectional views illustrating operations of a method of fabricating a semiconductor memory device, according to some embodiments of the inventive concepts. FIGS. 8A, 9A, 10A, 11A, and 12A are sectional views taken along the line A-A' of FIG. 4. FIGS. 8B, 9B, 10B, 11B, and 12B are sectional views taken along the line B-B' of FIG. 4. FIGS. 8C, 9C, 10C, 11C, and 12C are sectional views taken along the line C-C' of FIG. 4. FIGS. 8D, 9D, 10D, 11D, and 12D are sectional views taken along the line D-D' of FIG. 4.

Referring to FIGS. 4 and 8A to 8D, the substrate 100 may be patterned to form the trenches TR that defines the first and second active patterns AP1 and AP2. In other words, the trenches TR may be formed between the first and second active patterns AP1 and AP2.

The device isolation layer ST may be formed on the substrate 100 within the trenches TR. The device isolation layer ST may be formed of or include at least one insulating material (e.g., silicon oxide). The device isolation layer ST may be recessed to expose upper portions of the first and second active patterns AP1 and AP2. Accordingly, the upper portions of the first and second active patterns AP1 and AP2 may protrude vertically above the device isolation layer ST.

Referring to FIGS. 4 and 9A to 9D, sacrificial patterns PP may be formed that cross the first and second active patterns AP1 and AP2. The sacrificial patterns PP may be formed to have a line shape that extends in the first direction D1. In greater detail, the formation of the sacrificial patterns PP may include forming a sacrificial layer on the entire top surface of the substrate 100, forming hard mask patterns MA on the sacrificial layer, and patterning the sacrificial layer using the hard mask patterns MA as an etch mask. The sacrificial layer may be formed of or include polysilicon.

A pair of gate spacers GS may be formed on opposite side surfaces of each of the sacrificial patterns PP. The formation of the gate spacers GS may include forming a gate spacer layer on the substrate 100 that conforms to the side surfaces of the sacrificial patterns PP and anisotropically etching the gate spacer layer. The gate spacer layer may be formed of or include at least one of SiCN, SiCON, or SiN. Alternatively, the gate spacer layer may be a multi-layered structure including at least two of SiCN, SiCON, or SiN.

The first source/drain patterns SD1 may be formed in an upper portion of the first active pattern AP1. A pair of the first source/drain patterns SD1 may be formed at first and second sides of each of the sacrificial patterns PP. In greater detail, first recess regions RS1 may be formed by etching upper portions of the first active pattern AP1 using the hard mask patterns MA and the gate spacers GS as an etch mask. The device isolation layer ST between the first active patterns AP1 may be recessed during the etching of the upper portion of the first active pattern AP1.

The first source/drain pattern SD1 may be formed by performing a selective epitaxial growth process using an inner surface of the first recess region RS1 of the first active pattern AP1 as a seed layer. As a result of the formation of the first source/drain patterns SD1, a first channel pattern CH1 may be defined between each pair of the first source/drain patterns SD1. As an example, the first source/drain patterns SD1 may be formed of or include a semiconductor material (e.g., SiGe) whose lattice constant is greater than that of a semiconductor material of the substrate 100. Each of the first source/drain patterns SD1 may be a multi-layered structure including a plurality of semiconductor layers.

In some embodiments, during the selective epitaxial growth process, the first source/drain patterns SD1 may be doped in-situ with impurities. In some embodiments, impurities may be injected into the first source/drain patterns SD1 after the formation of the first source/drain patterns SD1. The first source/drain patterns SD1 may be doped to have a first conductivity type (e.g., p-type).

The second source/drain patterns SD2 may be formed in an upper portion of the second active pattern AP2. A pair of the second source/drain patterns SD2 may be formed at the first and second sides of each of the sacrificial patterns PP. In greater detail, second recess regions RS2 may be formed by etching the upper portion of the second active pattern AP2 using the hard mask patterns MA and the gate spacers GS as an etch mask.

The second source/drain pattern SD2 may be formed by performing a selective epitaxial growth process using an inner surface of the second recess region RS2 of the second active pattern AP2 as a seed layer. As a result of the formation of the second source/drain patterns SD2, the second channel pattern CH2 may be defined between each pair of the second source/drain patterns SD2. In some embodiments, the second source/drain patterns SD2 may be formed of or include the same semiconductor material (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. In other words, the first source/drain patterns SD1 and the second source/drain patterns SD2 may not be formed at the same time.

Referring to FIGS. 4 and 10A to 10D, the lower insulating layer LIL may be formed to cover the first and second source/drain patterns SD1 and SD2, the hard mask patterns MA and the gate spacers GS. In some embodiments, the lower insulating layer LIL may include a silicon oxide layer.

The lower insulating layer LIL may be planarized until the top surfaces of the sacrificial patterns PP are exposed. The planarization of the first interlayer insulating layer 110 may be performed using an etch-back or chemical mechanical polishing (CMP) process. All of the hard mask patterns MA may be removed during the planarization process. As a result, the first interlayer insulating layer 110 may have a top surface that is substantially coplanar with the top surfaces of the sacrificial patterns PP and the top surfaces of the gate spacers GS.

The insulating pattern SP may be formed by removing a portion of the exposed sacrificial pattern PP and filling the removed portion with an insulating material. Due to the presence of the insulating pattern SP, the gate electrode GE, which will be formed in a subsequent step, may be divided into the first to fourth gate electrodes GE1 to GE4.

The sacrificial patterns PP may be replaced with gate electrodes GE. In detail, the exposed sacrificial pattern PP may be selectively removed. As a result of the removal of the sacrificial pattern PP, an empty space may be formed. The gate insulating layer GI and the gate electrode GE may be sequentially formed in the empty space, which is formed by the removal of the sacrificial pattern PP.

The gate electrode GE and the gate spacer GS may be recessed, and then the gate capping pattern GP may be formed on the recessed gate electrode GE and the recessed gate spacer GS. The gate capping pattern GP may be formed of or include a material having an etch selectivity with respect to the lower insulating layer LIL.

The active contacts AC may be formed to penetrate the lower insulating layer LIL and may be electrically connected to the first and second source/drain patterns SD1 and SD2. In greater detail, a first photolithography process may be performed to form first contact holes in the lower insulating layer LIL. The first contact holes may define the active contacts AC. The first contact holes may be formed to expose the first and second source/drain patterns SD1 and SD2. The first contact holes may be formed in a self-aligned manner using the gate capping patterns GP as a mask.

The silicide patterns SC may be formed on the first and second source/drain patterns SD1 and SD2 that are exposed through the first contact holes. The active contact AC may be formed by sequentially forming the barrier pattern BM and the conductive pattern FM in the first contact hole. The active contact AC may be formed to have a top surface that is coplanar with the top surface of the gate capping pattern GP and the top surface of the lower insulating layer LIL.

Referring to FIGS. 4 and 11A to 11D, a mask pattern MAP may be formed on a region of the active contact AC. The mask pattern MAP may define a region of the active contact AC that will be used as the connecting portion CNP.

A recess hole RSH may be formed by etching a region that is not covered with the mask pattern MAP. The recess hole RSH may be formed using the mask pattern MAP as an etch mask. During the etching process for forming the recess hole RSH, an upper portion of the gate capping pattern GP may be recessed. During the etching process, a remaining portion of the active contact AC that is not covered with the mask pattern MAP may be recessed to form the recess portion RSP. The recess portion RSP of the active contact AC may have a top surface that is lower than the top surface of the gate electrode GE. In some embodiments, an upper portion of the lower insulating layer LIL may also be recessed during the etching process.

Referring to FIGS. 4 and 12A to 12D, the upper insulating layer UIL may be formed to fill the recess hole RSH. The upper insulating layer UIL may be formed of or include an insulating material that is the same as or different from the lower insulating layer LIL. The upper insulating layer UIL may cover the top surface of the recess portion RSP of the active contact AC. The upper insulating layer UIL and the lower insulating layer LIL may constitute the first interlayer insulating layer 110.

A sacrificial insulating layer SAL may be formed on the first interlayer insulating layer 110. The gate contact GC may be formed to penetrate the sacrificial insulating layer SAL and the gate capping pattern GP and may be electrically connected to the gate electrode GE.

In greater detail, a second photolithography process may be performed to form second contact holes penetrating the sacrificial insulating layer SAL. The second contact hole may define the gate contact GC. The second contact hole may be formed to expose the top surface of the gate electrode GE. The gate contact GC may be formed by sequentially forming the barrier pattern BM and the conductive pattern FM in the second contact hole. The gate contact GC may be formed to have a top surface that is coplanar with the top surface of the sacrificial insulating layer SAL.

The first gate contact GC1 of the gate contacts GC may be formed to overlap a portion of the second active contact AC2. Accordingly, the first gate contact GC1 may penetrate an upper portion of the second active contact AC2 and may be coupled to the top surface of the third gate electrode GE3. The first gate contact GC1 may be in direct contact with the second active contact AC2, and the first gate contact GC1 and the second active contact AC2 may form the first shared contact SHC1.

Referring to FIGS. 4 and 5A to 5E, a planarization process may be performed on the gate contacts GC and the sacrificial insulating layer SAL to expose the top surfaces of the active contacts AC. Accordingly, the sacrificial insulating layer SAL may be fully removed. The gate contact GC may have a top surface that is coplanar with the top surface of the active contact AC.

The second to fourth interlayer insulating layers 120, 130, and 140 may be sequentially formed on the first interlayer insulating layer 110. A back-end-of-line (BEOL) process may be performed to form the first interconnection layer M1 in the second interlayer insulating layer 120, to form the second interconnection layer M2 in the third interlayer insulating layer 130, and to form the third interconnection layer M3 in the fourth interlayer insulating layer 140.

In the method of fabricating a semiconductor memory device according to some embodiments of the inventive concepts, the active contact AC may be formed, and then, the gate contact GC may be formed to overlap at least partially the active contact AC. Accordingly, the gate contact GC may be formed to have the protruding portion PRP (e.g., see FIG. 6), which is buried in the active contact AC. As a result, it may be possible to reduce an electric resistance of the shared contact SHC (e.g., the first node N1) and to improve operational and electric characteristics (e.g., an operation speed) of the SRAM cell.

Figure 13:
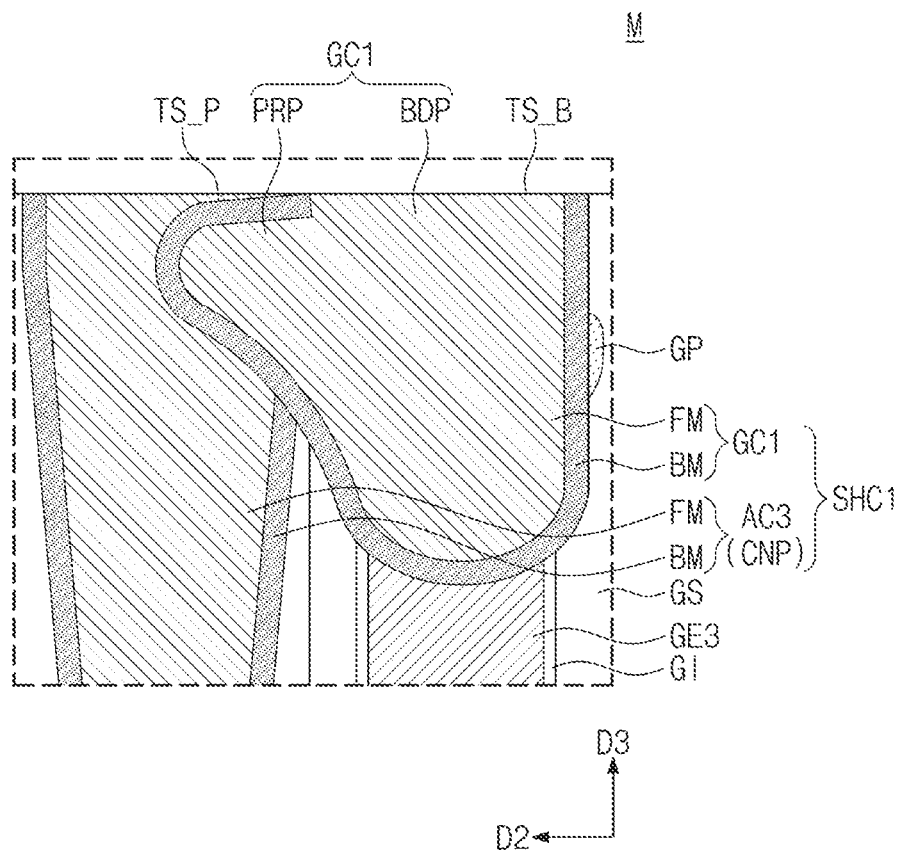
FIG. 13 is an enlarged sectional view that corresponds to the portion 'M' of FIG. 5B and illustrates a semiconductor memory device according to some embodiments of the inventive concepts.

FIG. 13 is an enlarged sectional view, which corresponds to the portion 'M' of FIG. 5B and is present to illustrate a semiconductor memory device according to some embodiments of the inventive concepts. In the following description, elements previously described with reference to FIGS. 4 to 7 may be identified by the previously used reference numbers without repeating description thereof for concise description.

Referring to FIG. 13, a top surface TS_P of the protruding portion PRP of the first gate contact GC1 may be lower than a top surface TS_B of the body portion BDP. The conductive pattern FM of the protruding portion PRP may be enclosed by the barrier pattern BM. A top surface of the conductive pattern FM of the protruding portion PRP may be covered with the barrier pattern BM. Since the top surface TS_P of the protruding portion PRP is formed at a level lower than the top surface TS_B of the body portion BDP, a contact area between the protruding portion PRP of the first gate contact GC1 and the third active contact AC3 may be further increased. As a result, in some embodiments, it may be possible to reduce an electric resistance of the first shared contact SHC1 and to improve operational and electric characteristics (e.g., an operation speed) of the SRAM cell.

Figure 14A:
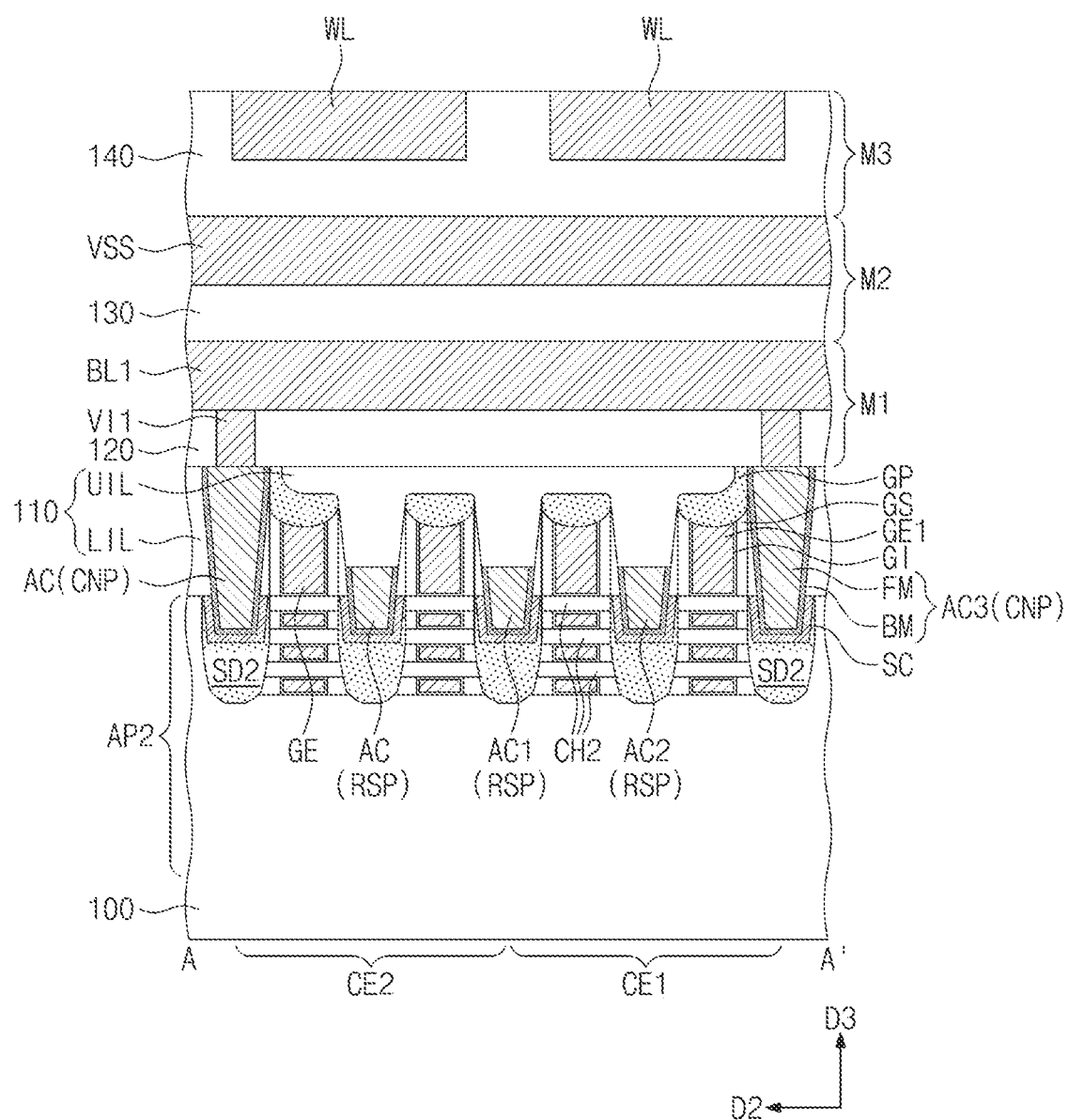
FIGS. 14A, 14B, and 14C are sectional views, respectively taken along the lines A-A', B-B', and D-D' of FIG. 4, and illustrating a semiconductor memory device according to some embodiments of the inventive concepts.
Figure 14B:
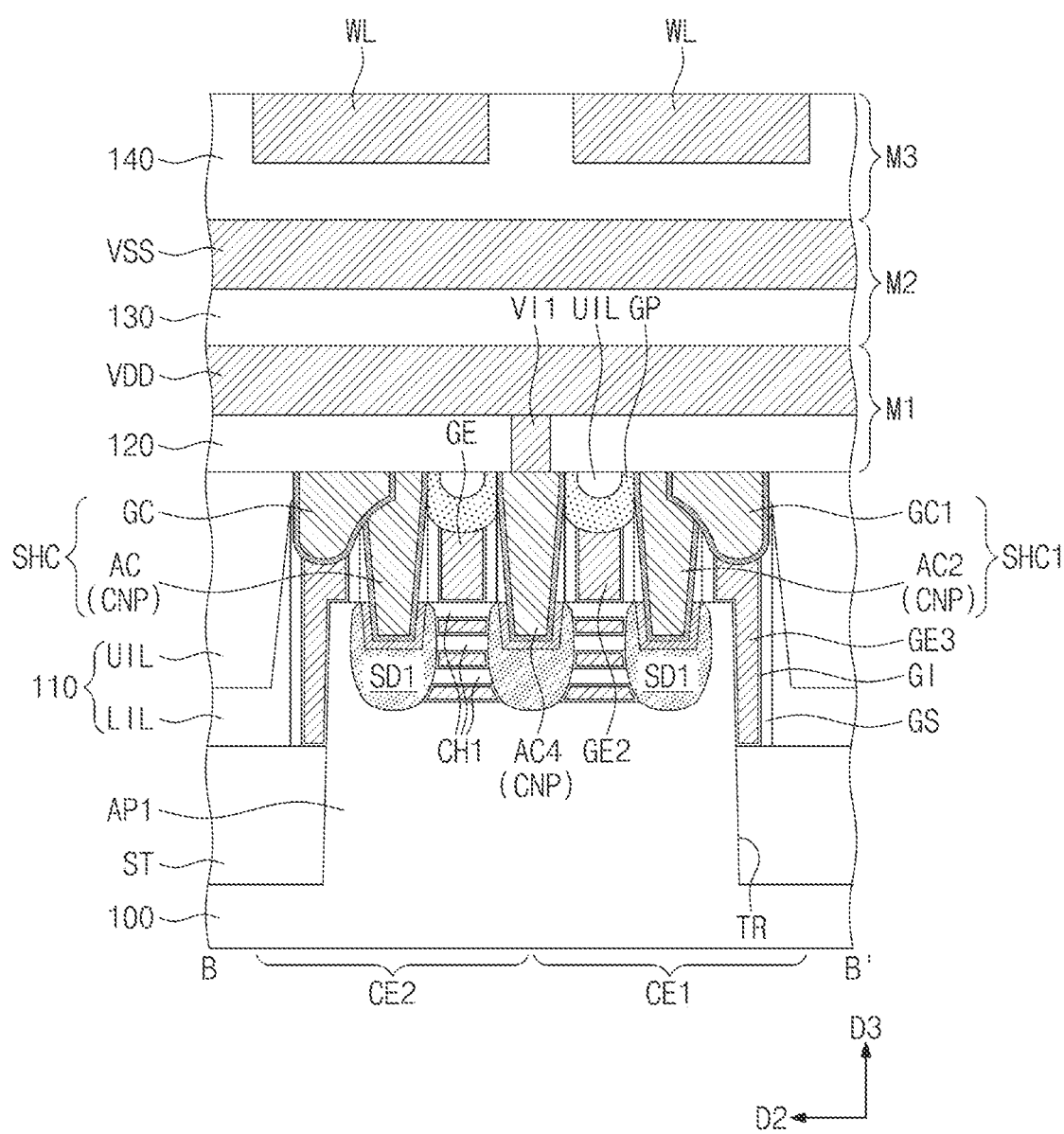
Figure 14C:
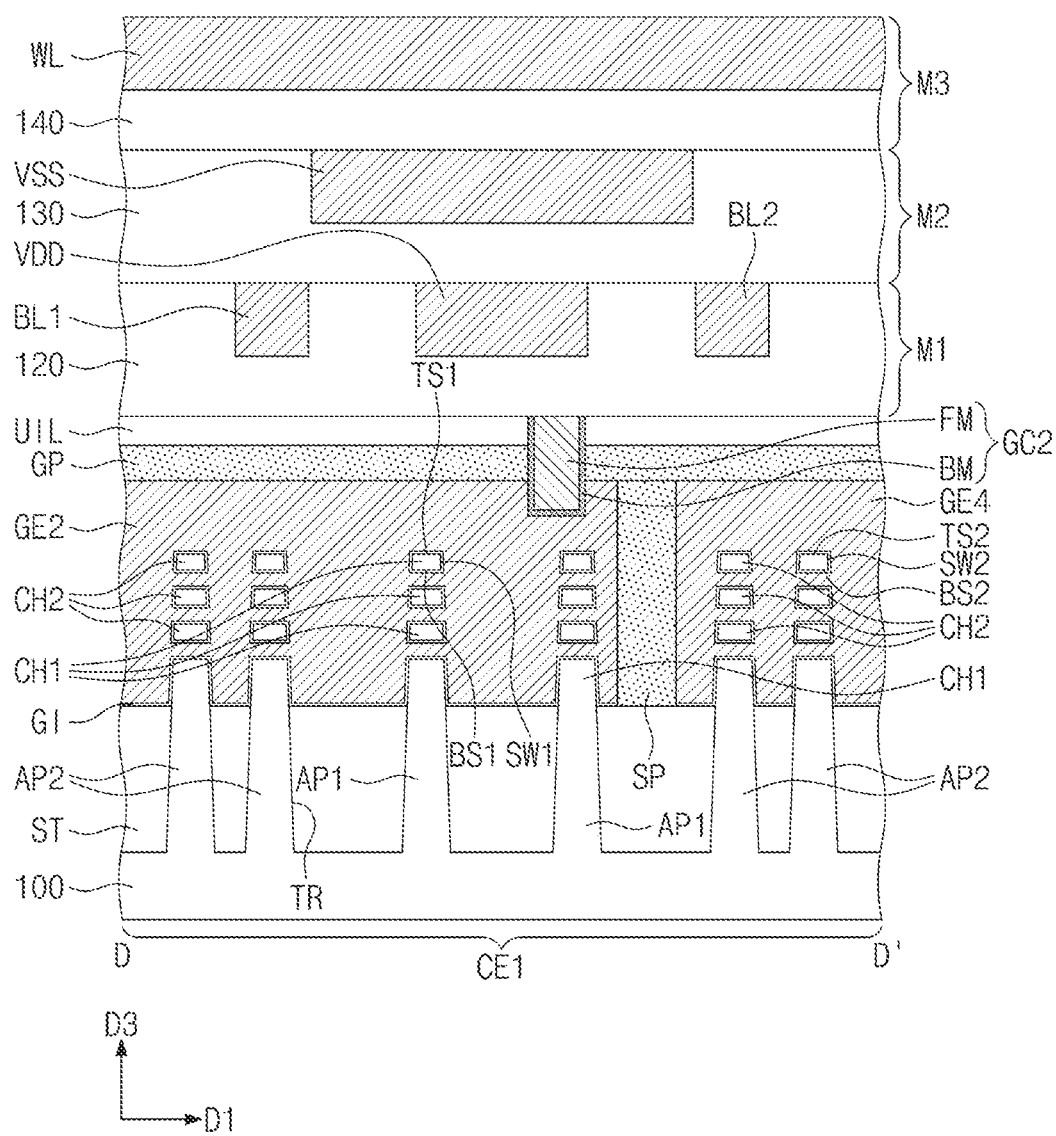

FIGS. 14A, 14B, and 14C are sectional views, which are respectively taken along the lines A-A', B-B', and D-D' of FIG. 4 to illustrate a semiconductor memory device according to some embodiments of the inventive concepts. In the following description, elements previously described with reference to FIGS. 4 and 5A to 5E may be identified by the previously used reference numbers without repeating description thereof for concise description.

Referring to FIGS. 4, 14A, 14B, and 14C, the first and second active patterns AP1 and AP2 may be provided on the substrate 100. The first active pattern AP1 may include the first channel patterns CH1, which are vertically stacked. The stacked first channel patterns CH1 may be spaced apart from each other in the third direction D3. The stacked first channel patterns CH1 may be vertically overlapped with each other. The second active pattern AP2 may include the second channel patterns CH2, which are vertically stacked. The stacked second channel patterns CH2 may be spaced apart from each other in the third direction D3. The stacked second channel patterns CH2 may be vertically overlapped with each other. The first and second channel patterns CH1 and CH2 may be formed of or include at least one of silicon (Si), germanium (Ge), or silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect the adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect the adjacent pair of the second source/drain patterns SD2 to each other.

The gate electrodes GE may cross the first and second channel patterns CH1 and CH2 and extend in the first direction D1. Portions of each of the gate electrodes GE may overlap the first and second channel patterns CH1 and CH2.

The gate electrode GE may enclose each of the first channel patterns CH1. In greater detail, the gate electrode GE may be provided on a first top surface TS1, first side surfaces SW1, and a first bottom surface BS1 of each of the first channel patterns CH1 (e.g., see FIG. 14C). The gate electrode GE may enclose each of the second channel patterns CH2. For example, the gate electrode GE may be provided on a second top surface TS2, second side surfaces SW2, and a second bottom surface BS2 of each of the second channel patterns CH2 (e.g., see FIG. 14C). The transistor according to some embodiments may be a three-dimensional field effect transistor (e.g., MBCFET or GAAFET) in which the gate electrode GE three-dimensionally surrounds the channel pattern CH1 or CH2.

The gate insulating layer GI may be between each of the first and second channel patterns CH1 and CH2 and the gate electrode GE. The gate insulating layer GI may enclose each of the first and second channel patterns CH1 and CH2.

An insulating pattern (not shown) may be on the second active pattern AP2 and interposed between the gate insulating layer GI and the second source/drain pattern SD2. The gate electrode GE may be spaced apart from the second source/drain pattern SD2 by the gate insulating layer GI and the insulating pattern. By contrast, the insulating pattern may not be on the first active pattern AP1 and may be omitted therefrom.

In an SRAM cell according to some embodiments of the inventive concepts, each of a first node and a second node may include a shared contact composed of an active contact and a gate contact. The gate contact may include a portion protruding toward the active contact, and this structure of the gate contact may make it possible to reduce an electric resistance of the shared contact and to prevent a misalignment issue from occurring between the gate contact and the active contact. Accordingly, according to some embodiments of the inventive concepts, it may be possible to improve reliability and electric characteristics of the semiconductor memory device.

While some example embodiments of the inventive concepts have been particularly shown and described, it will be understood by one of ordinary skill in the art that variations in form and detail may be made therein without departing from the scope of the attached claims.

What is claimed is:

1. A semiconductor memory device, comprising:
  an active pattern on a substrate, the active pattern comprising a source/drain pattern in an upper portion thereof;
  a gate electrode on the active pattern and extended in a first direction, the gate electrode and the source/drain pattern adjacent to each other in a second direction that crosses the first direction; and
  a shared contact coupled to the source/drain pattern and the gate electrode to electrically connecting the source/drain pattern with the gate electrode,
  wherein the shared contact comprises an active contact electrically connected to the source/drain pattern and a gate contact electrically connected to the gate electrode,
  wherein the gate contact comprises a body portion, which is coupled to the gate electrode, and a protruding portion, which protrudes from the body portion in the second direction, and
  wherein the protruding portion extends into the active contact and is buried in the active contact.

2. The semiconductor memory device of claim 1, wherein the protruding portion overlaps the active contact in a third direction that is perpendicular to the first and second directions, and
  wherein the body portion is horizontally offset from the active contact.

3. The semiconductor memory device of claim 1, wherein the active contact and the gate contact each include a barrier pattern and a conductive pattern,
  wherein the barrier pattern covers a surface of the conductive pattern, and
  the barrier pattern of the protruding portion is interposed between the conductive pattern of the protruding portion and the conductive pattern of the active contact.

4. The semiconductor memory device of claim 1, wherein the body portion has a top surface that is coplanar with a top surface of the active contact.

5. The semiconductor memory device of claim 4, wherein a top surface of the protruding portion is coplanar with the top surface of the active contact.

6. The semiconductor memory device of claim 4, wherein a top surface of the protruding portion is lower than the top surface of the active contact.

7. The semiconductor memory device of claim 1, wherein the protruding portion is located farther from the substrate than a bottom surface of the body portion is from the substrate.

8. The semiconductor memory device of claim 1, wherein the active contact comprises a connecting portion and a recess portion,
  wherein the connecting portion is in contact with the protruding portion, and
  wherein a top surface of the recess portion is closer to the substrate than a top surface of the connecting portion is to the substrate.

9. The semiconductor memory device of claim 8, further comprising an upper insulating layer on the recess portion,
  wherein the top surface of the connecting portion is coplanar with a top surface of the upper insulating layer.

10. The semiconductor memory device of claim 1, wherein the active pattern comprises an active fin that protrudes above a device isolation layer, or wherein the active pattern comprises a plurality of channel pattern that are vertically stacked.

11. A semiconductor memory device, comprising an SRAM cell on a substrate,
  wherein the SRAM cell comprises:
  first pull-up/down transistors and second pull-up/down transistors; and
  a first node connecting a first common source/drain of the first pull-up/down transistors to a first common gate of the second pull-up/down transistors,
  wherein the first node comprises a first shared contact that is coupled to the first common source/drain and the first common gate to electrically connect the common source/drain with the first common gate, wherein the first shared contact comprises an active contact that is electrically connected to the first common source/drain, and wherein the first shared contact comprises a gate contact that is electrically connected to the first common gate, wherein the gate contact comprises a body portion that is coupled to the first common gate, and a protruding portion that protrudes from the body portion toward the active contact, wherein a top surface of the body portion is coplanar with a top surface of the active contact, wherein the protruding portion that vertically overlaps the active contact, and wherein the body portion is horizontally offset from the active contact.

12. The semiconductor memory device of claim 11, wherein a top surface of the protruding portion is coplanar with the top surface of the active contact.

13. The semiconductor memory device of claim 11, wherein a top surface of the protruding portion is closer to the substrate than the top surface of the active contact is to the substrate.

14. The semiconductor memory device of claim 11, wherein the active contact comprises a connecting portion and a recess portion,
   wherein the connecting portion is in contact with the protruding portion, and
   wherein a top surface of the recess portion is closer to the substrate than a top surface of the connecting portion is to the substrate.

15. The semiconductor memory device of claim 11, wherein the SRAM cell further comprises a second node connecting a second common source/drain of the second pull-up/down transistors to a second common gate of the first pull-up/down transistors, and
   wherein the second node comprises a second shared contact, which is coupled to the second common source/drain and the second common gate to electrically connect the second common source/drain with the second common gate.

16. A semiconductor memory device, comprising:
   a substrate including a bit cell region;
   a first active pattern and a second active pattern on the bit cell region, the first active pattern being spaced apart from the second active pattern in a first direction, the first active pattern comprising a first source/drain pattern provided in an upper portion thereof, the second active pattern comprising a second source/drain pattern provided in an upper portion thereof;
   a device isolation layer provided on the substrate to cover a side surface of a lower portion of each of the first and second active patterns, an upper portion of each of the first and second active patterns extending above the device isolation layer;
   a gate electrode provided on the first active pattern and extended in the first direction, the gate electrode and the first source/drain pattern adjacent to each other in a second direction;
   a gate insulating layer between the gate electrode and the first active pattern;
   a gate spacer on at least one side surface of the gate electrode;
   a gate capping pattern on the gate electrode;
   an interlayer insulating layer on the gate capping pattern;
   an active contact that extends through the interlayer insulating layer, is coupled to the first and second source/drain patterns, and is extended in the first direction to connect the first and second source/drain patterns to each other;
   a silicide pattern between each of the first and second source/drain patterns and the active contact;
   a gate contact that extends through the gate capping pattern and is coupled to the gate electrode; and
   a first interconnection layer, a second interconnection layer, and a third interconnection layer that are sequentially stacked on the interlayer insulating layer,
   wherein the gate contact comprises a body portion, which is coupled to the gate electrode, and a protruding portion, which protrudes from the body portion in the second direction, and
   wherein the protruding portion extends into the active contact and is buried in the active contact.

17. The semiconductor memory device of claim 16, wherein the first interconnection layer comprises a bit line, and
   wherein the third interconnection layer comprises a word line.

18. The semiconductor memory device of claim 16, wherein the first source/drain pattern has a p-type conductivity, and
   wherein the second source/drain pattern has an n-type conductivity.

19. The semiconductor memory device of claim 16, wherein the protruding portion vertically overlaps the active contact, and
   wherein the body portion is horizontally offset from the active contact.

20. The semiconductor memory device of claim 16, wherein the gate contact and the active contact are connected to each other as a shared contact, and
   wherein the shared contact connects the first and second source/drain patterns to the gate electrode electrically.

* * * * *